United States Patent
Guo et al.

(10) Patent No.: US 12,418,129 B2
(45) Date of Patent: Sep. 16, 2025

(54) HYBRID CARD-EDGE CONNECTORS AND POWER TERMINALS FOR HIGH-POWER APPLICATIONS

(71) Applicant: FCI USA LLC, Etters, PA (US)

(72) Inventors: Rongzhe Guo, Chengdu (CN); Clarence Randall Fry, Mount Holly Springs, PA (US); Chao Zou, Chengdu (CN)

(73) Assignee: FCI USA LLC, Etters, PA (US)

( * ) Notice: Subject to any disclaimer, the term of this patent is extended or adjusted under 35 U.S.C. 154(b) by 0 days.

(21) Appl. No.: 18/660,952

(22) Filed: May 10, 2024

(65) Prior Publication Data

US 2025/0015528 A1    Jan. 9, 2025

Related U.S. Application Data

(63) Continuation of application No. 18/132,094, filed on Apr. 7, 2023, now Pat. No. 12,009,613, which is a
(Continued)

(30) Foreign Application Priority Data

Nov. 20, 2018   (CN) ......................... 201811382876.1

(51) Int. Cl.
   *H01R 13/24* (2006.01)
   *H01R 12/70* (2011.01)
   (Continued)

(52) U.S. Cl.
   CPC ..... *H01R 13/2492* (2013.01); *H01R 12/7088* (2013.01); *H01R 12/721* (2013.01);
   (Continued)

(58) Field of Classification Search
   CPC .......................... H01R 13/2492; H01R 13/26; H01R 12/7088; H01R 12/721; H01R 12/724;
   (Continued)

(56) References Cited

U.S. PATENT DOCUMENTS

| 4,040,713 A | 8/1977 | Konnemann |
| 4,324,451 A | 4/1982 | Ammon et al. |

(Continued)

FOREIGN PATENT DOCUMENTS

| CN | 102781176 A | 11/2012 |
| CN | 102804512 A | 11/2012 |

(Continued)

OTHER PUBLICATIONS

International Search Report and Written Opinion mailed Sep. 27, 2019 in connection with International Application No. PCT/CN2019/095891.

(Continued)

*Primary Examiner* — Peter G Leigh
(74) *Attorney, Agent, or Firm* — Wolf, Greenfield & Sacks, P.C.

(57) ABSTRACT

A power terminal includes first and second conductive sheets. The first conductive sheet includes a first joining portion, first fingers extending from the first joining portion, and a first mounting portion extending from the first joining portion and configured to mount to a substrate. The first fingers have hooked ends connected to the first joining portion by first beams. The second conductive sheet includes a second joining portion, second fingers extending from the second joining portion, and a second mounting portion extending from the second joining portion and configured to mount to the substrate. The two second fingers have curved ends connected to the second joining portion by second beams. The hooked ends and the curved ends include contact (Continued)

surfaces configured to contact a same side of a card. At least one of the first and second mounting portions includes at least two mounting tails.

20 Claims, 27 Drawing Sheets

Related U.S. Application Data continuation of application No. 17/295,001, filed as application No. PCT/CN2019/095891 on Jul. 12, 2019, now Pat. No. 11,626,681.

(51) Int. Cl.
| | |
|---|---|
| *H01R 12/72* | (2011.01) |
| *H01R 13/26* | (2006.01) |
| *H05K 1/02* | (2006.01) |
| *H05K 1/11* | (2006.01) |
| *H05K 5/00* | (2006.01) |

(52) U.S. Cl.
CPC ........... *H01R 13/26* (2013.01); *H05K 1/0213* (2013.01); *H05K 1/117* (2013.01); *H05K 5/0026* (2013.01); *H01R 12/724* (2013.01); *H01R 12/727* (2013.01)

(58) Field of Classification Search
CPC .... H01R 12/727; H05K 1/0213; H05K 1/117; H05K 5/00266
USPC ......................................................... 439/637
See application file for complete search history.

(56) References Cited

U.S. PATENT DOCUMENTS

| | | | |
|---|---|---|---|
| 4,734,041 A | 3/1988 | Bruchmann et al. | |
| 6,394,818 B1 * | 5/2002 | Smalley, Jr. ......... | H01R 12/727 |
| | | | 439/682 |
| 6,645,012 B2 | 11/2003 | Ito et al. | |
| 6,652,322 B2 | 11/2003 | Ito et al. | |
| 6,672,886 B2 * | 1/2004 | Billman ............... | H01R 12/737 |
| | | | 439/82 |
| 6,685,512 B2 | 2/2004 | Ooya | |
| 6,997,751 B2 * | 2/2006 | Miyamoto ......... | H01R 13/2457 |
| | | | 439/630 |
| 7,104,812 B1 | 9/2006 | Bogiel et al. | |
| 7,247,062 B1 | 7/2007 | Polnyi | |
| 7,637,783 B2 | 12/2009 | Sasaoka et al. | |
| 7,985,097 B2 | 7/2011 | Gulla | |
| 8,202,117 B2 | 6/2012 | Pan | |
| 8,480,434 B2 | 7/2013 | Funayama et al. | |
| 8,550,855 B2 | 10/2013 | Zhang et al. | |
| 8,672,713 B2 | 3/2014 | Tajiri et al. | |
| 8,840,406 B2 | 9/2014 | Hirata | |
| 9,054,456 B2 | 6/2015 | Orris et al. | |
| 9,070,990 B2 | 6/2015 | Flickinger et al. | |
| 9,160,105 B2 | 10/2015 | Takaki | |
| 9,160,122 B2 | 10/2015 | Sato | |
| 9,190,753 B2 | 11/2015 | Takaki | |
| 9,196,986 B2 | 11/2015 | Tanaka et al. | |
| 9,225,089 B2 | 12/2015 | Sato | |
| 9,236,678 B2 | 1/2016 | Joo et al. | |
| 9,287,654 B2 | 3/2016 | Takaki | |
| 9,608,349 B2 | 3/2017 | Mashiyama et al. | |
| 9,666,962 B1 | 5/2017 | Bucher | |
| 9,935,385 B2 | 4/2018 | Phillips et al. | |
| 9,941,613 B2 | 4/2018 | Zhao | |
| 9,966,679 B2 | 5/2018 | Xu et al. | |
| 10,096,920 B2 | 10/2018 | Lee | |
| 10,128,589 B2 | 11/2018 | Yamaguchi | |
| 10,283,910 B1 | 5/2019 | Chen et al. | |
| 10,637,175 B1 | 4/2020 | Zou et al. | |
| 10,873,146 B2 | 12/2020 | Zou et al. | |
| 11,626,681 B2 | 4/2023 | Guo et al. | |
| 12,009,613 B2 | 6/2024 | Guo et al. | |
| 2002/0022381 A1 * | 2/2002 | Ito ..................... | H01R 12/721 |
| | | | 439/60 |
| 2002/0098740 A1 * | 7/2002 | Ooya .................. | H01R 12/721 |
| | | | 439/630 |
| 2002/0119704 A1 * | 8/2002 | Ito ..................... | H01R 12/721 |
| | | | 439/636 |
| 2006/0189222 A1 * | 8/2006 | Bogiel ................ | H01R 12/724 |
| | | | 439/884 |
| 2007/0004291 A1 * | 1/2007 | Bogiel ................ | H01R 12/724 |
| | | | 439/884 |
| 2009/0170373 A1 | 7/2009 | Pan | |
| 2012/0115371 A1 | 5/2012 | Chuang et al. | |
| 2012/0164892 A1 * | 6/2012 | Ke ..................... | H01R 27/02 |
| | | | 439/676 |
| 2012/0252275 A1 | 10/2012 | Tajiri et al. | |
| 2013/0005190 A1 | 1/2013 | Blanchfield et al. | |
| 2015/0163944 A1 | 6/2015 | Goodwin et al. | |
| 2016/0043494 A1 | 2/2016 | Mashiyama et al. | |
| 2017/0054241 A1 | 2/2017 | Sato et al. | |
| 2017/0373419 A1 * | 12/2017 | Lee ..................... | H01R 13/02 |
| 2018/0034174 A1 | 2/2018 | Yamaguchi | |
| 2018/0097320 A1 * | 4/2018 | Hashiguchi ........ | H01R 13/2492 |
| 2018/0191093 A1 | 7/2018 | Phillips et al. | |
| 2018/0212344 A1 | 7/2018 | Li et al. | |
| 2020/0161791 A1 | 5/2020 | Zou et al. | |
| 2020/0212616 A1 | 7/2020 | Zou et al. | |
| 2022/0013942 A1 | 1/2022 | Guo et al. | |
| 2022/0021142 A1 | 1/2022 | Copper et al. | |
| 2023/0246373 A1 | 8/2023 | Guo et al. | |
| 2024/0145959 A1 | 5/2024 | Cheng et al. | |
| 2024/0178594 A1 | 5/2024 | Zou et al. | |

FOREIGN PATENT DOCUMENTS

| | | | | |
|---|---|---|---|---|
| CN | 103636069 A | 3/2014 | | |
| CN | 104103931 A | 10/2014 | | |
| CN | 204668547 U | 9/2015 | | |
| CN | 105375145 A | 3/2016 | | |
| CN | 205583210 U | 9/2016 | | |
| CN | 205846279 U | 12/2016 | | |
| CN | 106299769 A | 1/2017 | | |
| CN | 206301977 U | 7/2017 | | |
| CN | 206727256 U | 12/2017 | | |
| CN | 207183596 U | 4/2018 | | |
| CN | 207381578 U | 5/2018 | | |
| CN | 109326909 A | 2/2019 | | |
| CN | 208939193 U | 6/2019 | | |
| DE | 10310899 B3 * | 5/2004 | ......... | H01R 12/7088 |
| DE | 102017103604 A1 | 8/2017 | | |
| DE | 102017213140 A1 | 2/2018 | | |
| JP | 2016-110966 A | 6/2016 | | |
| TW | M422792 U | 2/2012 | | |
| TW | M436982 | 9/2012 | | |
| TW | M561346 U | 6/2018 | | |
| WO | WO 2017/193684 A1 | 11/2017 | | |

OTHER PUBLICATIONS

Taiwanese Office Action dated Oct. 5, 2022 in connection with Taiwanese Application No. 108142216.
[No Author Listed], New Product: High Density Plus (HD+) Card Edge Power Connectors. TE Connectivity. Nov. 27, 2018. 3 pages. URL:https://www.te.com/usa-en/about-te/news-center/new-hd-plus-card-edge-connectors.html [retrieved on May 18, 2021].

* cited by examiner

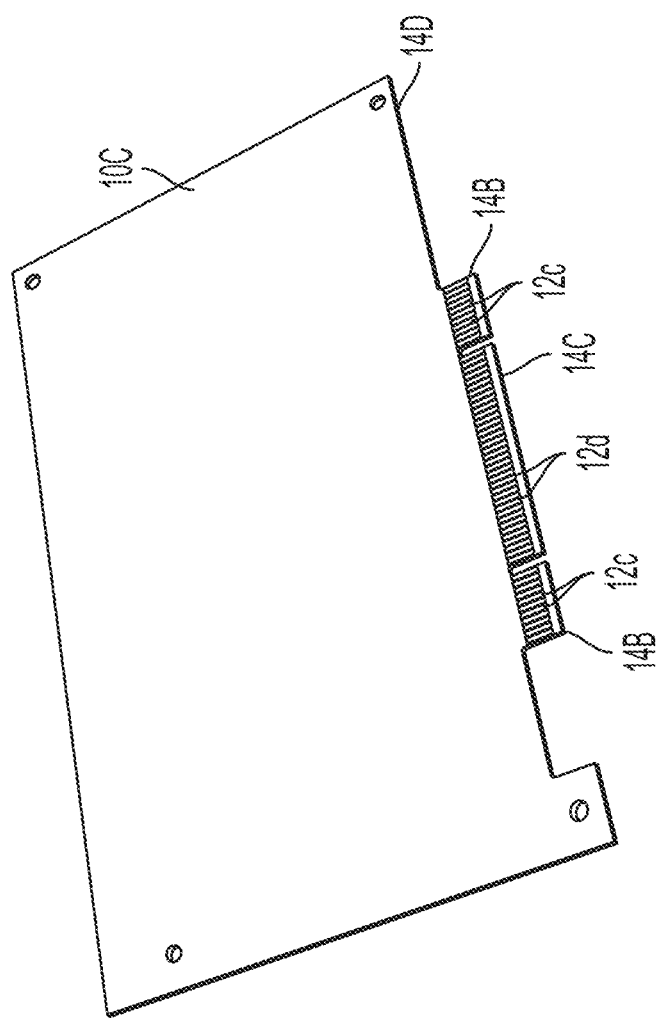

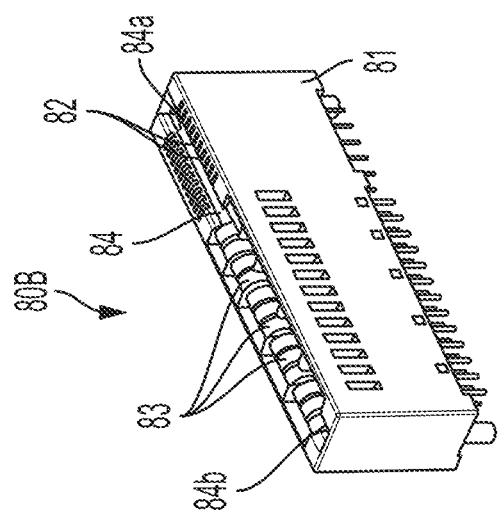
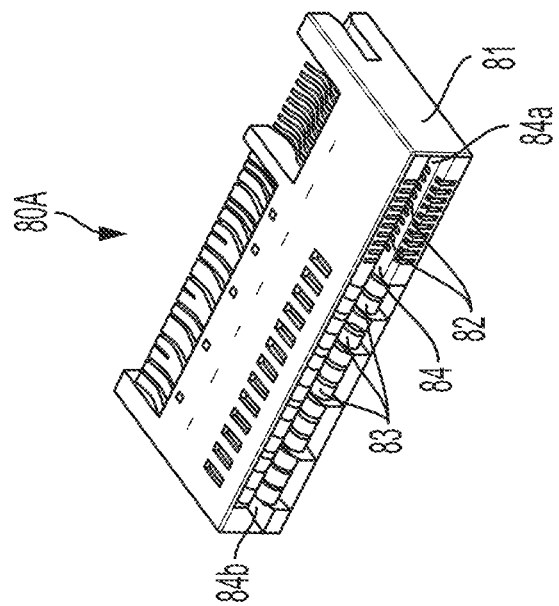
FIG. 8B
FIG. 8A

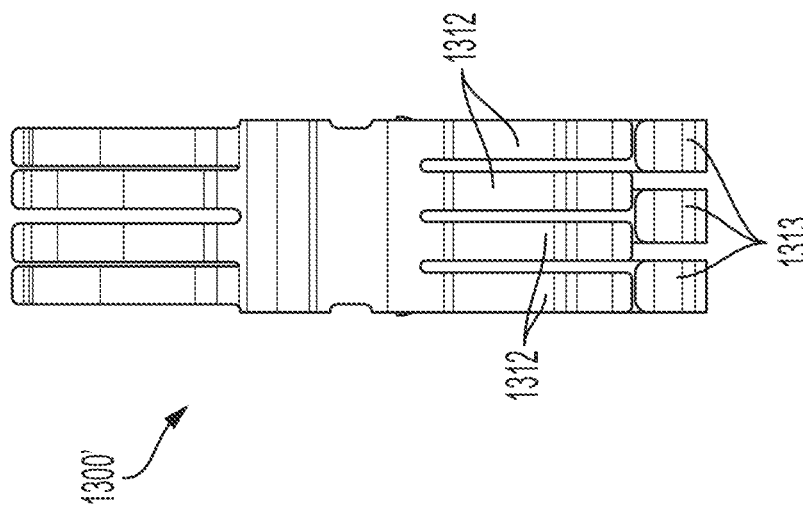
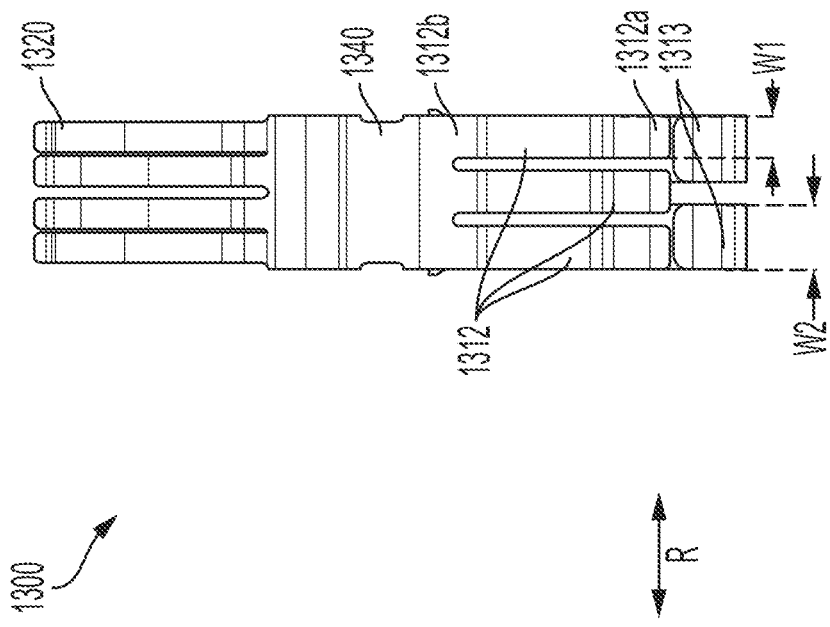
FIG. 13A
FIG. 13A'

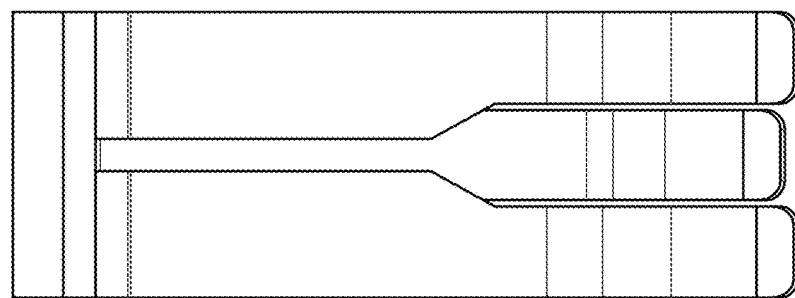
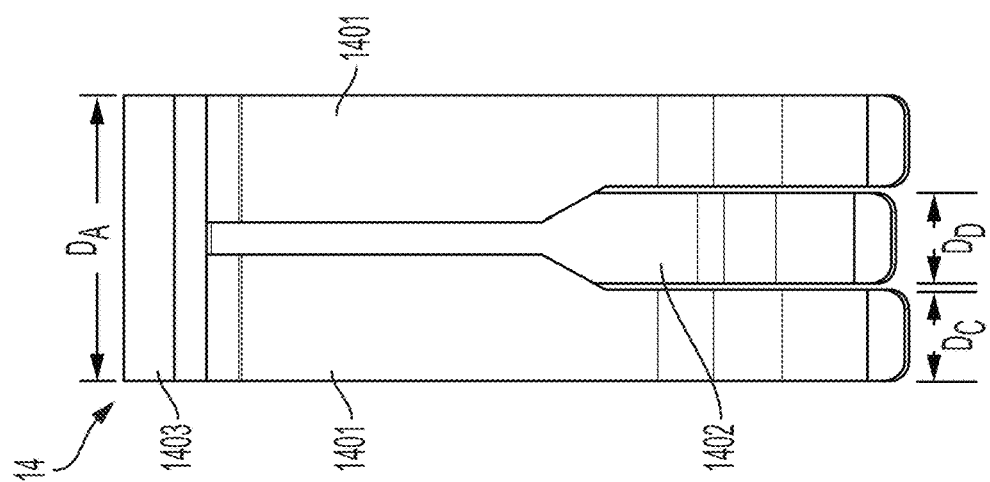
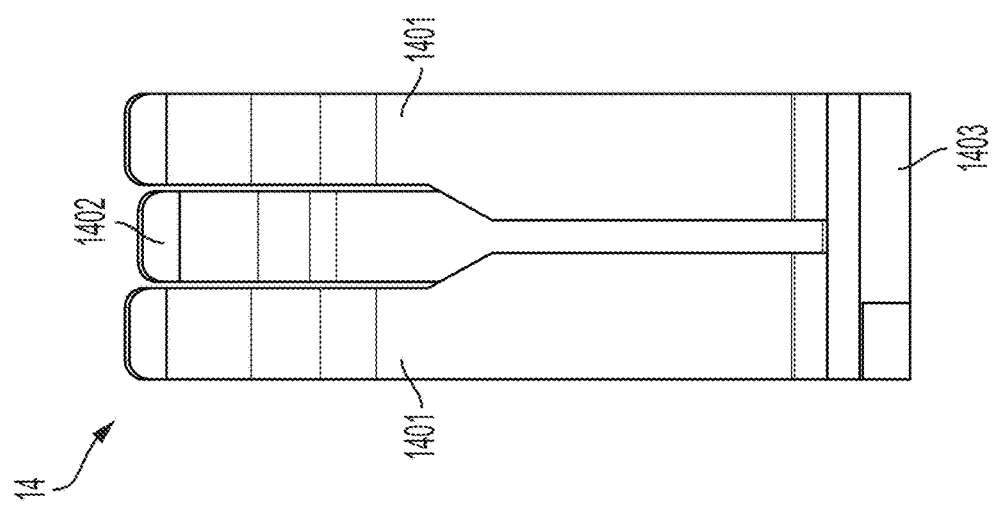
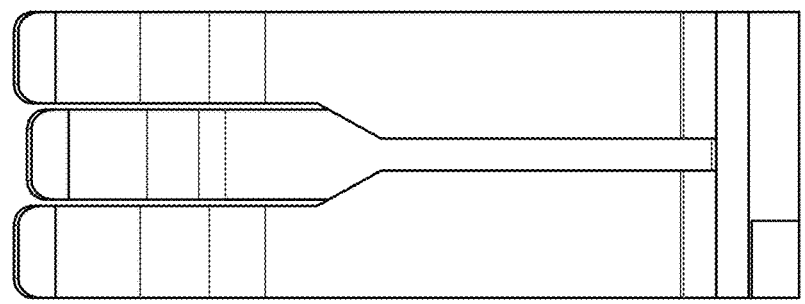
FIG. 15A'  FIG. 15A  FIG. 15B  FIG. 15B'

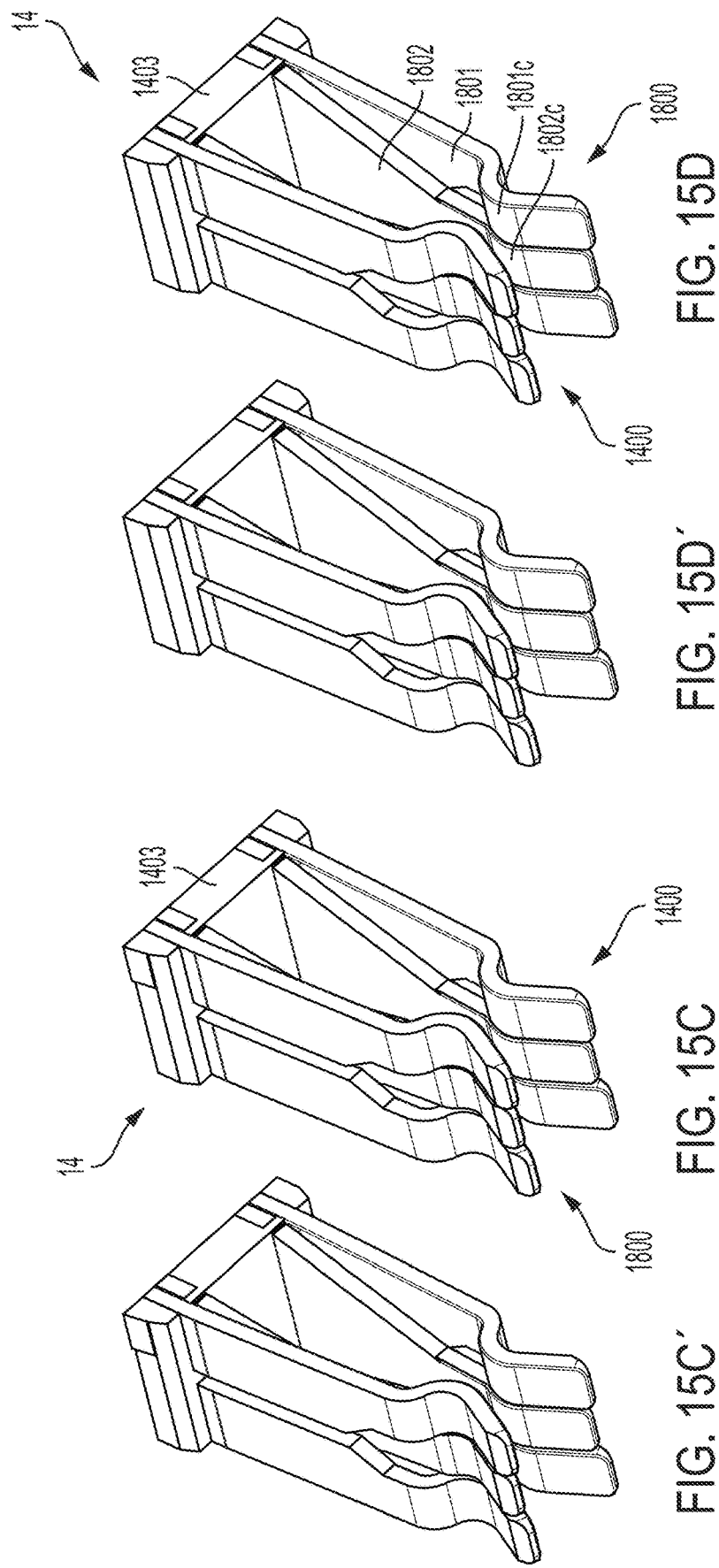

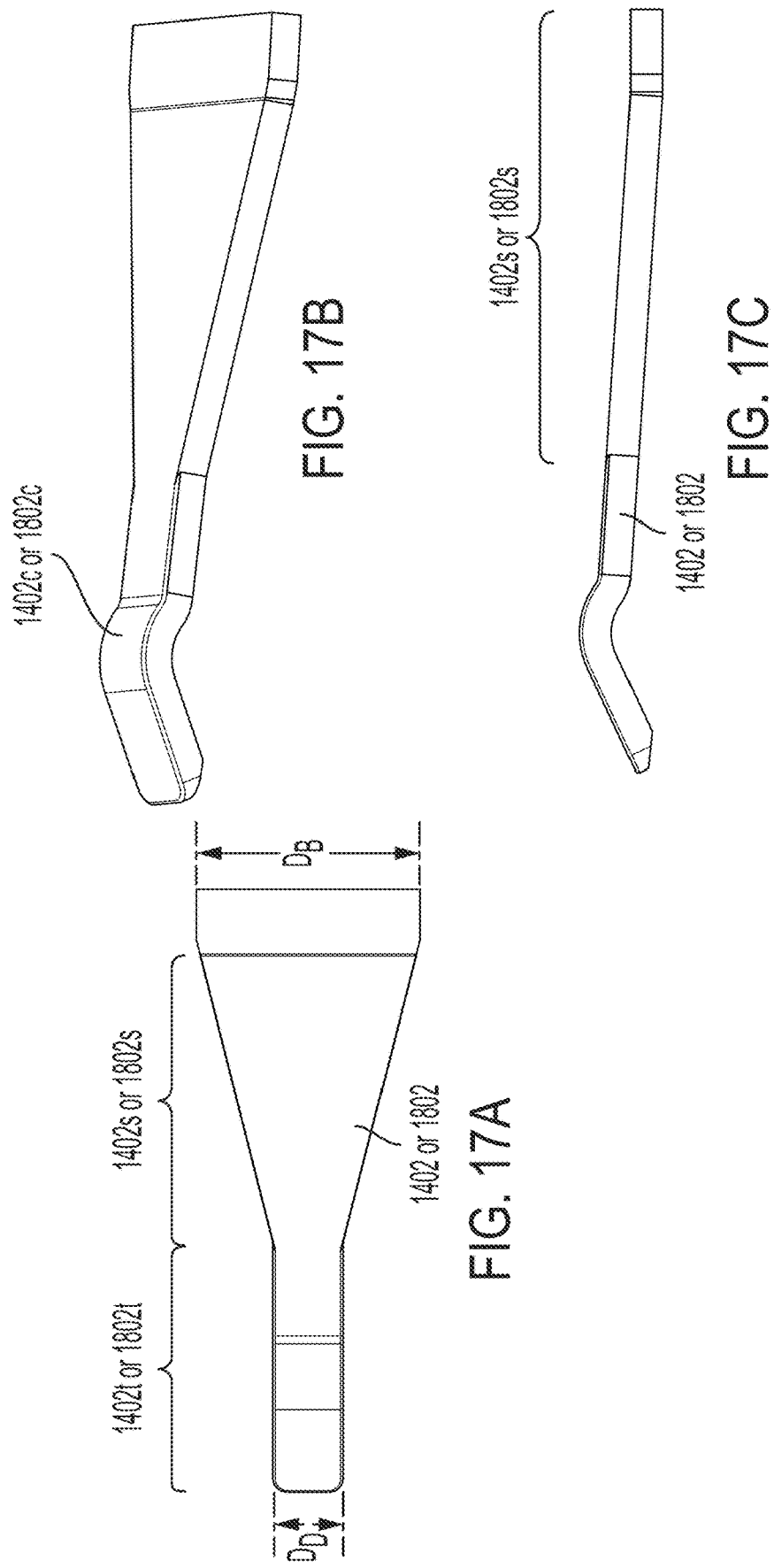

HYBRID CARD-EDGE CONNECTORS AND POWER TERMINALS FOR HIGH-POWER APPLICATIONS

CROSS-REFERENCE TO RELATED APPLICATIONS

This application is a continuation of U.S. application Ser. No. 18/132,094, filed on Apr. 7, 2023, entitled "HYBRID CARD-EDGE CONNECTORS AND POWER TERMINALS FOR HIGH-POWER APPLICATIONS," which is a continuation of U.S. application Ser. No. 17/295,001, filed on May 18, 2021, entitled "HYBRID CARD-EDGE CONNECTORS AND POWER TERMINALS FOR HIGH-POWER APPLICATIONS," which is a 35 U.S.C. § 371 National Phase filing of International Application No. PCT/CN2019/095891, filed on Jul. 12, 2019, entitled "HYBRID CARD-EDGE CONNECTORS AND POWER TERMINALS FOR HIGH-POWER APPLICATIONS," which claims priority to and the benefit of Chinese Patent Application No. 201811382876.1, filed on Nov. 20, 2018. The contents of these applications are incorporated herein by reference in their entireties.

FIELD OF THE DISCLOSURE

The technology disclosed herein relates generally to electrical interconnection systems and more specifically to edge-type electrical connectors and power terminals useable in high-power applications.

BACKGROUND

Electrical connectors are used in many electrical systems. Electronic devices have been provided with assorted types of connectors whose primary purpose is to enable data, commands, power and/or other signals to pass between electronic assemblies. A connector that carries both signals and power is sometimes called a hybrid connector. It is generally easier and more cost effective to manufacture an electrical system as separate electronic assemblies that may be joined with electrical connectors. For example, one type of electronic assembly is a printed circuit board ("PCB"). The terms "card" and "PCB" may be used interchangeably herein.

In some scenarios, a two-piece connector is used to join two assemblies. One connector may be mounted to each of the assemblies. The connectors may be mated, forming connections between the two assemblies.

In some other scenarios, a PCB may be joined directly to another electronic assembly via a one-piece connector, which may be configured as a card edge connector. The PCB may have pads along an edge that is designed to be inserted into an electrical connector attached to another assembly. Contacts within the electrical connector may contact the pads, thus connecting the PCB to the other assembly.

As will be appreciated, the connections provided by the electrical connectors are electrical connections that may communicate electrical signals and/or electrical power (e.g., electrical current and/or voltage).

SUMMARY

The structures of high-power electrical connectors and connector terminals able to carry electrical power and electrical signals are of great importance to electrical systems that may require high-power operation and/or a small size.

According to some aspects of the present technology, a power terminal for use in a connector is provided. The power terminal may comprise a first plurality of first fingers and a second plurality of second fingers. The first plurality may be greater in number than the second plurality. The first plurality of first fingers may comprise first ends spaced apart from each other in a first direction and second ends connected to each other. The second plurality of second fingers may comprise first ends spaced apart from each other in the first direction and second ends connected to each other. The first ends of the second fingers may be spaced apart from the first ends of the first fingers in a second direction, perpendicular to the first direction.

The second ends of the first fingers may be electrically connected to the second ends of the second fingers at a joint region. The first ends of the first fingers may have first contact points configured to contact a first side of a card, and the first ends of the second fingers may have second contact points configured to contact the first side of the card. The first contact points may be different from the second contact points.

According to some aspects of the present technology, a power terminal assembly for a card edge connector is provided. The terminal assembly may comprise first and second terminals and an insulative housing supporting the first and second terminals. Each of the first and second terminals may comprise a first plurality of first fingers comprising first ends spaced apart from each other in a first direction and second ends connected to each other, and a second plurality of second fingers comprising first ends spaced apart from each other in the first direction and second ends connected to each other. For each of the first and second terminals: the first ends of the second fingers may be spaced apart from the first ends of the first fingers in a second direction, perpendicular to the first direction; the first plurality may be greater in number than the second plurality; and the second ends of the first fingers may be electrically connected to the second ends of the second fingers at a joint region.

For the first terminal, the first ends of the first fingers may have first contact points configured to contact a first side of a card, the first ends of the second fingers may have second contact points configured to contact the first side of the card, and the first contact points may be different from the second contact points. For the second terminal, the first ends of the first fingers may have first contact points configured to contact a second side of the card, the first ends of the second fingers may have second contact points configured to contact the second side of the card, and the first contact points may be different from the second contact points. A portion of each of the first and second terminals may be disposed in the insulative housing such that the first and second contact points of the second terminal may face the first and second contact points of the first terminal across a gap.

According to some aspects of the present technology, a power terminal for a connector is provided. The power terminal may comprise first and second conductive sheets. The first conductive sheet may comprise at least two first fingers comprising first ends spaced apart from each other and second ends connected to each other. The second conductive sheet may comprise a second finger comprising a first end and a second end.

The first ends of the first and second fingers each may have a contact surface thereon. The first end of the second finger may be positioned in a space between the first ends of adjacent ones of the first fingers. The second finger may comprise a first segment comprising the first end of the second finger and having a first average width, and a second segment joined to the first segment and having a second average width greater than the first average width.

According to some aspects of the present technology, a power terminal for a connector is provided. The terminal may comprise a first terminal portion comprising a plurality of metal layers stacked in a layer direction. Each metal layer may comprise fingers arranged in a row direction different from the layer direction. The fingers of the metal layers may form rows of contact surfaces such that a first row of contact surfaces corresponding to a first one of the metal layers may be parallel to a second row of contact surfaces corresponding to a second one of the metal layers.

The fingers of the first one of the metal layers may comprise distal ends curved into hooks having convex surfaces. The first row of contact surfaces may be disposed on the convex surfaces of the hooks of the first one of the metal layers. The fingers of the second one of the metal layers may comprise curved distal ends having convex surfaces. The second row of contact surfaces may be disposed on the convex surfaces of the curved distal ends of the fingers of the second one of the metal layers. The rows of contact surfaces of the metal layers of the first terminal portion may be configured to contact a same mating surface.

Features described herein may be used, separately or together in any combination, in any of the embodiments discussed herein.

BRIEF DESCRIPTION OF DRAWINGS

Various aspects and embodiments of the present technology disclosed herein are described below with reference to the accompanying figures. It should be appreciated that the figures are not necessarily drawn to scale. Items appearing in multiple figures may be indicated by the same reference numeral. For the purposes of clarity, not every component may be labeled in every figure.

FIGS. 8A and 8B show hybrid connectors that may be used to connect to a hybrid card, according to embodiments of the present technology.

FIG. 13A shows a plan view of a power terminal, according to an embodiment of the present technology.

FIG. 13A' shows a plan view of a power terminal, according to an embodiment of the present technology.

FIGS. 15A, 15A', 15B, and 15B' show top and bottom plan views of a power terminal assembly, according to an embodiment of the present technology.

FIGS. 15C, 15C', 15D, and 15D' show top and bottom perspective views of the power terminal assembly of FIGS. 15A, 15A', 15B, and 15B'.

FIG. 17A shows a bottom plan view of a second finger, according to an embodiment of the present technology.

FIG. 17B shows a bottom perspective view of the second finger of FIG. 17A.

FIG. 17C shows a side elevational view of the second finger of FIG. 17A.

DETAILED DESCRIPTION

The inventors have recognized and appreciated designs for interconnection of electronic assemblies to enable compact, less expensive and high functionality electronic systems. Such systems require power to be delivered to or from assemblies in relatively small spaces. These designs include adaptations to card edge connectors, and the cards that mate with them, to support large power flow through small spaces without undesired effects, such as large heat generation and damage to the system that might result from the heat generated.

Figure 1A:
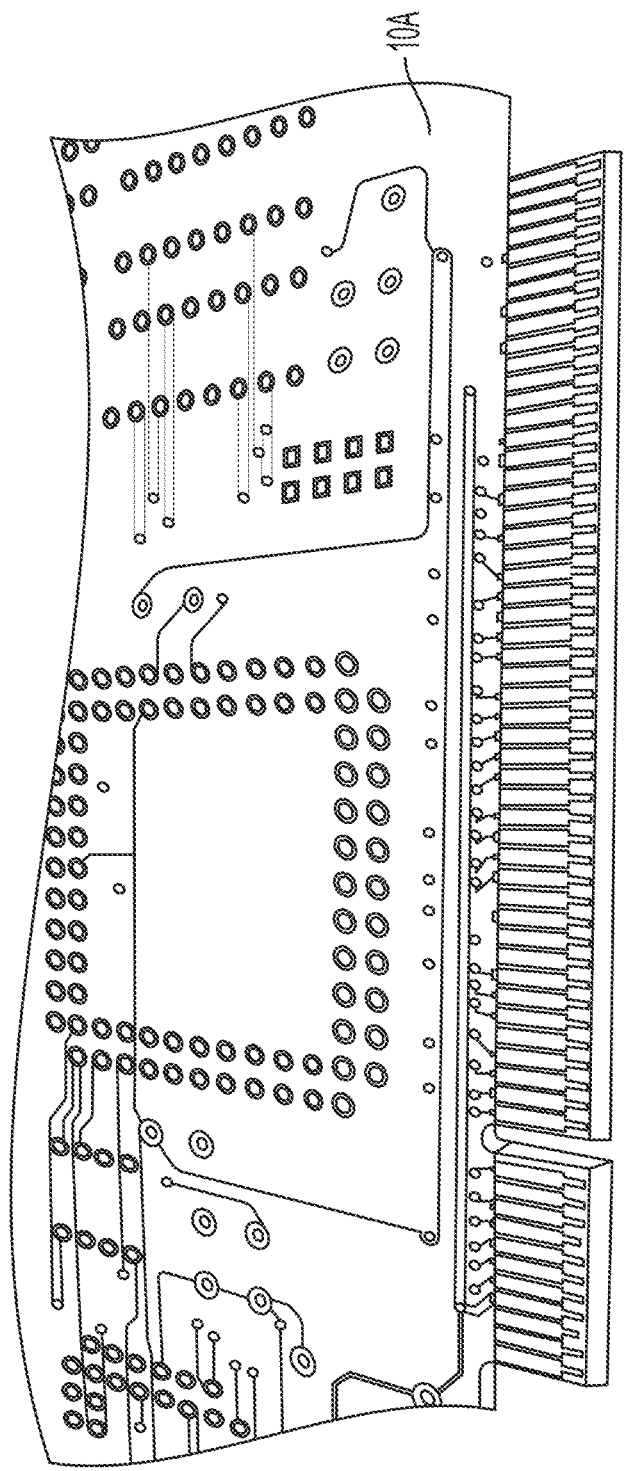
FIGS. 1A, 1B, and IC each show an example of a printed circuit board (PCB) configured to connect with an edge connector.
Figure 1B:
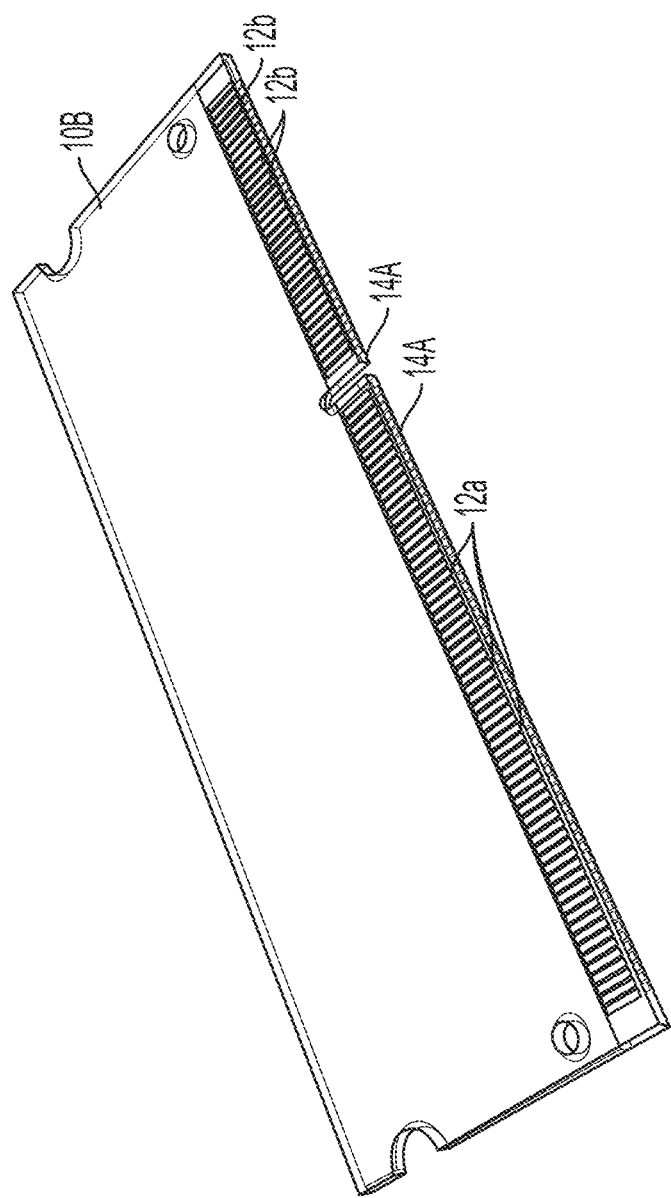

FIGS. 1A-1C show examples of PCBs 10A, 10B, 10C configured for insertion into card edge connectors. Electrical contacts, here shown as surface pads, may be placed on one or more edges of a PCB in a variety of different configurations. FIG. 1A illustrates a portion of a PCB 10A. As can be seen, the PCB 10A may have multiple vias, exposed at a surface. The vias may provide connections to conductive structures inside the PCB 10A. Semiconductor chips and other components may be mounted to the PCB 10A by attaching their leads to the vias such that signals and power may pass through the conductive structures to or from those components. Within the PCB 10A, signal traces, patterned on each of multiple layers, may carry the signals. Power may be carried on power planes, which may be interspersed between layers of signal traces. Pads at the edge of the PCB 10A also may be connected to those conductive structures within the PCB 10A so that they may be connected to other locations in an electronic system when those pads are inserted into a connector. Certain of the pads, serving as signal terminals, may be connected to traces inside the PCB 10A whereas others of the pads, serving as power terminals, may be connected to power planes within the PCB 10A. The components attached to the PCB 10A may consume power that is delivered to the PCB 10A through the power terminals. Alternatively, the components attached to the PCB 10A may condition or otherwise deliver power through the power terminals, where it can then be routed to other components in an electronic system. Regardless of the direction in which power is flowing, onto or off of the PCB 10A, techniques as described herein may be applied to the PCB and the card edge connector. In many electronic system, however, a large amount of power may flow from a PCB acting as a power supply and then through a card edge connector, such that techniques as described herein may be selectively applied to those components in some embodiments.

FIG. 1B shows another example of a PCB 10B configured for insertion in a card edge connector. In this example, the PCB 10B is shown schematically, without components, vias, or traces, for simplicity of illustration. In the illustrated example, electrical terminals 12a, 12b on the PCB 10B may be located on a main edge 14A of the PCB 10B. In a further example, shown in FIG. 1C, electrical terminals 12c, 12d on a PCB 10C may be located on edge protrusions 14B, 14C, which extend from a main edge 14D of the PCB 10C. The edges 14A, 14B, 14C on which electrical terminals are located may be insertion edges, which are edges configured to be inserted into edge connectors.

The electrical terminals 12a, 12b, 12c, 12d may be configured to carry electrical signals and/or to supply power (e.g., current, voltage). Within an electronic assembly, power may be differentiated from signals based on frequency, voltage, or current. Power is usually low frequency, such as 60 Hz or less, and often DC. Power also is usually higher voltage than a signal, with voltage levels of 5 V, 12 V, or higher. In contrast, signals may be less than 5 V, and often less than 3 V. Likewise, power is usually higher current, often in the range of amps or tens of amps, whereas signals will be on the order of milliamps.

In the example of FIG. 1B, the electrical terminals 12a may be configured to carry signals to/from the PCB 10B, and the electrical terminals 12b may be configured to supply power. In another example, in the PCB 10C, the electrical terminals 12c on the left of the electrical terminals 12d may be configured to carry power to/from the PCB 10C, the electrical terminals 12d may be configured to carry signals, and the electrical terminals 12c on the right of the electrical terminals 12d may be configured to carry power. FIGS. 1A-1C illustrate that PCBs designed for mating with a card edge connector may have any of a number of terminal configurations, and techniques as described herein may be applied with PCBs having any suitable terminal configuration.

Figure 2A:
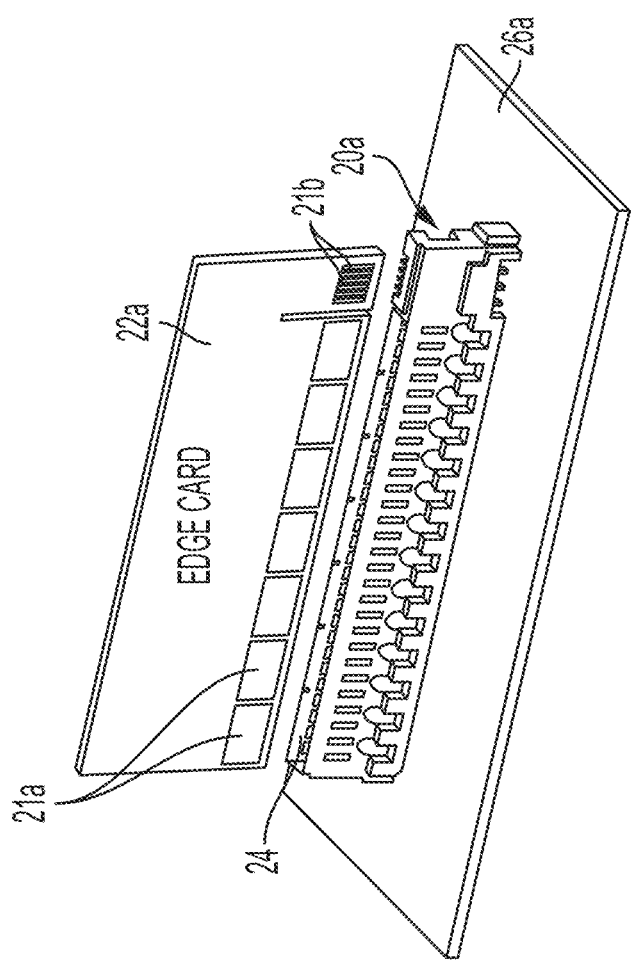
FIG. 2A is an illustration of a vertically oriented connection arrangement.

Card-edge connectors may be configured to mate with PCBs in any of multiple orientations. For example, FIG. 2A shows an example of a vertically oriented card-edge connector 20a configured to receive a PCB 22a in a slot 24. A mounting end of the connector 20a may be configured to be mounted on a substrate 26a, which may be another printed circuit board, such as a backplane, with the slot 24 positioned to receive the PCB 22a when it is oriented to extend vertically with respect to the surface of the substrate 26a.

Figure 2B:
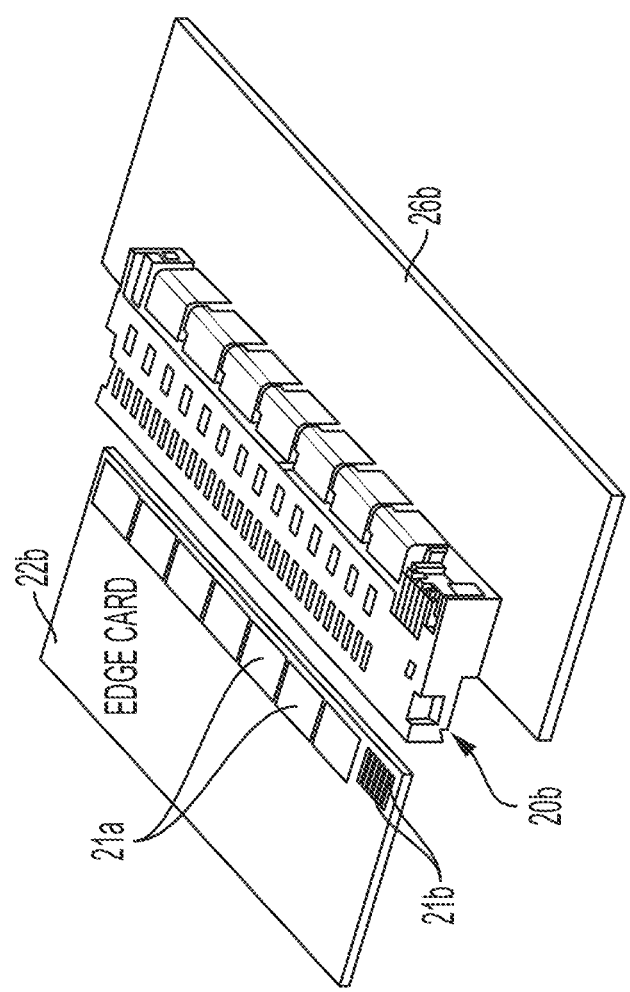
FIG. 2B is an illustration of a right-angle oriented connection arrangement.

FIG. 2B shows an example of a right-angle oriented card-edge connector 20b configured to receive a PCB 22b in a slot (not visible in the figure). A mounting end of the connector 20b may be configured to mount at a right angle on a substrate 26b. The substrate 26b may also be a PCB, such as a motherboard in an electronic system, but it should be understood that connectors and card designs may be used with substrates of any suitable type. In this example, the PCB 22b is parallel to the substrate 26b.

Figure 2C:
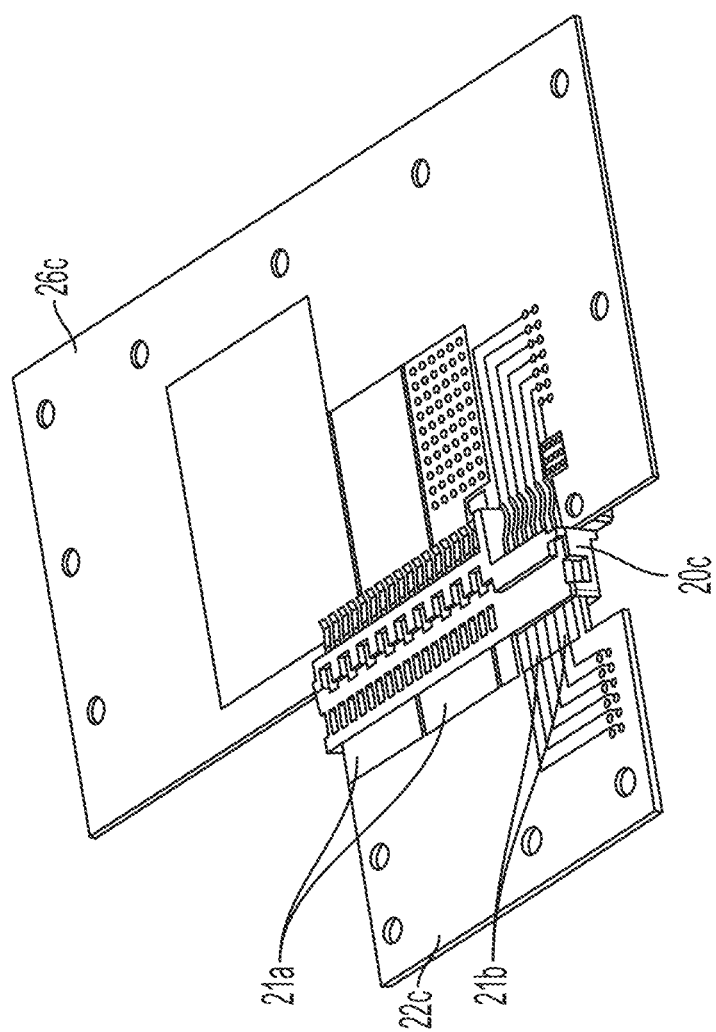
FIG. 2C is an illustration of a parallel board (straddle-mount) connection arrangement.

FIG. 2C shows an example of a straddle-mount card-edge connector 20c with a slot in which a PCB 22c is inserted; a mounting end of the connector 20c may be configured to mount horizontally on a substrate 26c. In the illustrated example, contact tails extending from the connector 20c have a portion aligned with an upper surface of the substrate 26c. Another portion of the contact tails extending from the connector 20c are aligned with a lower surface of the substrate 26c. Such a configuration is sometimes called a straddle mount and may be used for connecting parallel boards. As will be appreciated, card-edge connectors may be configured to attach to a substrate in other orientations. The techniques as described herein may be used with mounting orientations as illustrated in FIGS. 2A-2C, or in any other suitable mounting orientation.

Each of FIGS. 2A-2C shows a portion of an electronic system. A full system may have multiple connectors mounted to a substrate, which may provide connections between multiple PCBs inserted into those connectors. Further, the substrate may be connected to other components through cables, bus bars or other than through card edge connectors.

Figure 3:
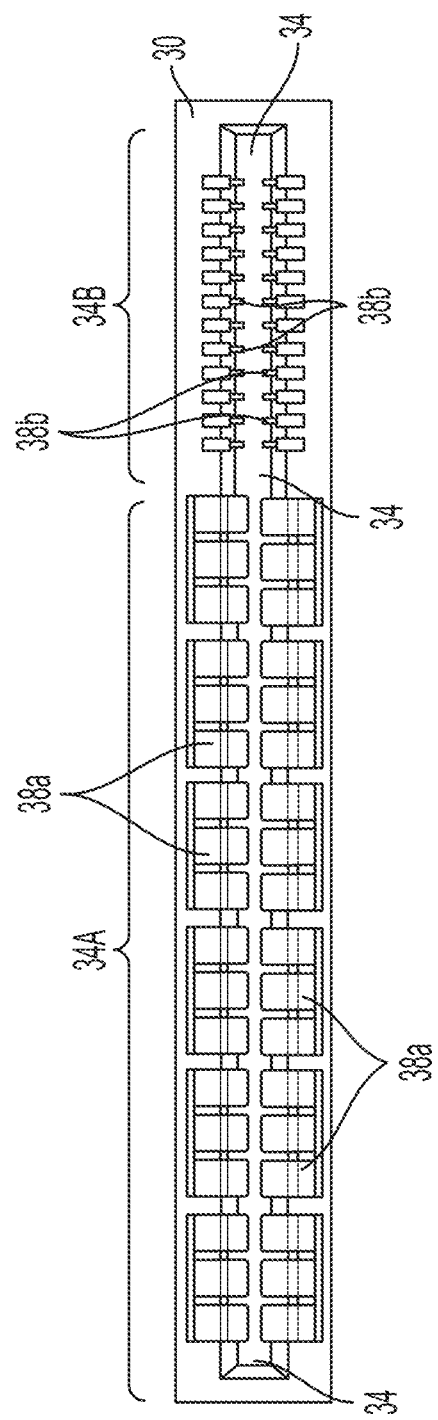
FIG. 3 shows a plan view of a card-receiving face of an edge connector.

FIG. 3 illustrates a plan view of a card-receiving face of a card-edge connector 30. The connector 30 may be, for example, the vertically oriented card-edge connector 20a or the right-angle oriented card-edge connector 20b or the horizontally oriented card-edge connector 20c. The connector 30 may comprise a slot 34 configured to receive a card. The slot 34 may comprise a power section 34A having power terminals 38a arranged to contact corresponding power contact-pads of a PCB. For example, the terminals 38a may be arranged to contact power contact-pads 21a of the PCB 22a (or 22b or 22c). The slot 34 also may comprise a signal section 34B having signal terminals 38b arranged to contact corresponding signal contact-pads of a PCB. For example, the terminals 38b may be arranged to contact signal contact-pads 21b of the PCB 22a (or 22b or 22c).

As illustrated in the example of FIG. 3, the power terminals 38a may be wider than the signal terminals 38b. Such a design enables the power terminals 38a to carry more current than the signal terminals 38*b*, without excessive heating. The larger cross-sectional area of the power terminals 38*a* provides a lower contact resistance, a lower bulk resistance, and a lower current density, all of which contribute to less heating within the connector when a relatively large amount of current passes through the power terminals 38*a*.

FIGS. 2A-2C illustrate that a PCB, designed for insertion into a card edge connector, may be made with power contact pads that mate with wider power terminals For example, FIG. 2A shows that the power pads 21*a* may be wider than the signal contact pads 21*b*. Similar relative dimensions of signal and power pads are also shown for the PCBs 22*b* and 22*c*.

The inventors have recognized and appreciated designs for power terminals for card edge connectors that can pass larger amounts of power with an acceptable amount of heating. Current flow is often used as an indication of delivered power, because power and current are related, and heating is proportional to current flow. Acceptable heating may be expressed as temperature rise at a rated current. As a specific example, a connector, or a power terminal within the connector, may have a rated current capacity that reflects the amount of current that will increase the temperature from ambient conditions by a set amount, such as 30° C.

Examples of improved power terminals that can pass large amounts of current are given below in connection with FIGS. 13A-17C.

The inventors have recognized and appreciated that for high-power applications, connectors with improved terminal designs may handle more current than can pass through a PCB inserted into that connector without causing an unacceptable level of heating within the PCB. For example, a design may require a PCB to deliver a current of up to 480 amps, with a maximum temperature increase of 30° C. above an ambient temperature. A conventional approach to designing a PCB for higher-current use is to make the PCB have more power planes, which makes the PCB thicker. Increased layer count is usually necessary because the width of the PCB is often set by a need to fit within a specific space. Moreover, widely used PCB manufacturing processes tend to use copper films having a thickness in a predefined range to form power planes within the PCB, such that the thickness of each power plane cannot be arbitrarily increased to increase a current-carrying capacity of the PCB. As a result, increasing layer count is a conventional approach to increasing a current-carrying capacity of a PCB. The increase in layer count of the PCB, however, may not be desirable for some types of electronic systems where, for example, portability and thus a small size or weight is required, or where low cost is desired.

Different approaches to PCB design may expand the utility of improved power terminals and card-edge connectors. A hybrid PCB card ("hybrid card" or "hybrid board" or "hybrid circuit board assembly" herein) may be used for high-power applications.

Figure 4:
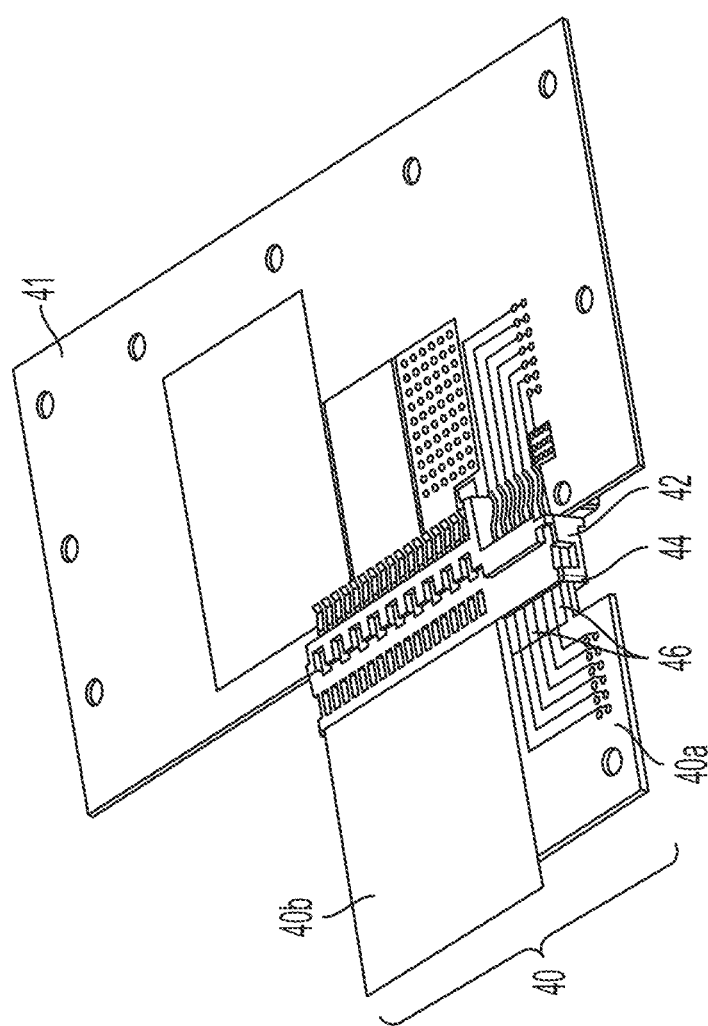
FIG. 4 shows a hybrid card mated with a hybrid connector, according to an embodiment of the present technology.

FIG. 4 shows a hybrid card 40 mated with a hybrid connector 42, according to some embodiments of the present technology. The hybrid card 40 may be a subassembly acting as a power supply, for example, but may be configured for any suitable functions, as described above. The hybrid connector 42 may be mounted on a substrate 41. The substrate 41 may be a mother card, a backplane, or another assembly within the electronic system.

A slot 44 of the hybrid connector 42 may be structured to receive the hybrid card 40. The hybrid card 40 may have a signal portion 40*a* and a power portion 40*b*. The signal portion 40*a* may include signal contact-pads 46 arranged to contact signal terminals of the hybrid connector 42. Electronic components, such as those that regulate or condition power, if the hybrid card 40 is a power supply, may be mounted to the signal portion 40*a* using conventional printed circuit board manufacturing techniques.

The power portion 40*b* may comprise a blade of conductive material. For example, the power portion 40*b* may comprise any of the following:
- a solid piece of elemental metal having high conductivity (e.g., Cu, Al);
- a solid piece of an alloy of metals (e.g., a Cu alloy); or
- a solid plate or core clad with a high-conductivity metal (e.g., a Cu plate clad with Au, a steel plate clad with Cu, a resin plate clad with Cu); or
- a laminate with layers of high conductivity material interspersed with lower conductivity materials.

For instance, the blade may be comprised of any of the following: a solid piece of copper; a core that is clad with a thick layer of copper; a core that is clad with a thick layer of copper and a surface layer of gold; a core that is clad with a thick layer of copper, a layer of silver, and a surface layer of gold; a laminated structure with a thin insulative layer separating two thicker conductive layers; etc. As will be appreciated, the high-conductivity material may be a metal alloy. The core may be made of any material having properties that enable it to be formed into a card-like or blade-like shape and that may be clad with another material without adversely reacting with the other (cladding) material. For example, the core may be made of aluminum.

The power portion 40*b* may have an edge suitable for a contact surface, which may be inserted into a portion of a hybrid connector containing power terminals, like the power pads 21*a*, illustrated above. The contact surface may result from the use of suitable material to form the blade or from coating or plating a portion of the blade with a coating that resists oxidation, including, for example, a gold plating or a multilayer plating.

The power portion 40*b* may be configured as a conductive blade, as pictured in the examples herein. As will appreciated, the conductive blade 40*b* may comprise any high-conductivity material able to conduct electrical current sufficient for applications requiring at least 3000 W of power, and having sufficient rigidity to withstand repeated mating and unmating with a connector. For example, the cladding may be a layer of Cu that has a thickness of at least 0.14 mm, or at least 0.5 mm, or at least 1 mm, or at least 1.5 mm.

Figure 5A:
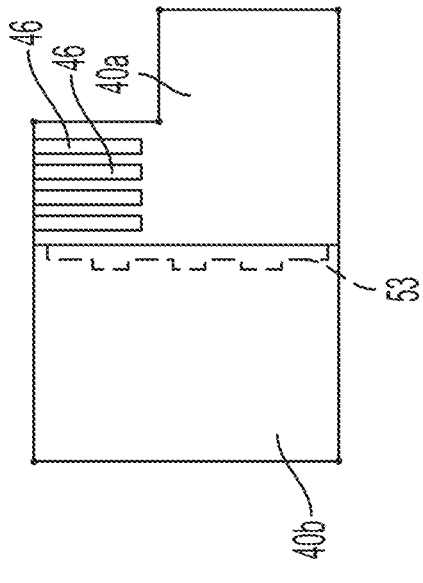
FIGS. 5A, 5B, 5C, and 5D each schematically shows an example of a hybrid card in which a signal portion is joined with a power portion to form a single assembly, according to embodiments of the present technology.
Figure 5B:
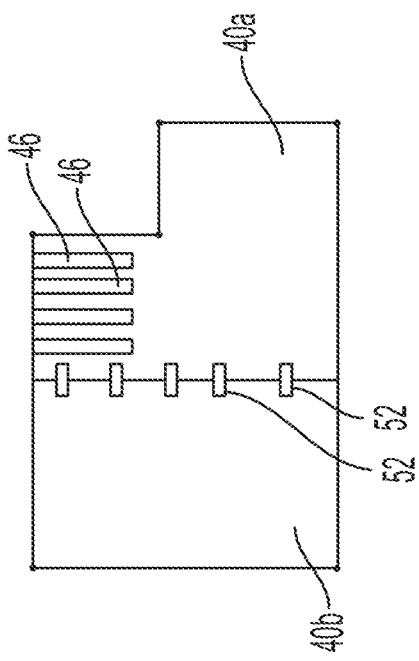

The signal portion 40*a* and the conductive blade 40*b* may be held together as a single assembly. One or more support members may be used to hold the signal portion 40*a* and the conductive blade 40*b* in a side-by-side configuration. In one example shown in FIG. 5A, at least one edge clip 52 may join together an edge of the signal portion 40*a* and an edge of the conductive blade 40*b*. The support members may be or may include parts of signal portion 40*a* and/or the conductive blade 40*b*. In another example, shown in FIG. 5B, an edge of the conductive blade 40*b* may be structured with a slot or recess 53 to accommodate therein an edge of the signal portion 40*a*. The slot 53 may be profiled with a pattern (dotted lines), and the edge of the signal portion 40*a* may be profiled in a complementary pattern, to ensure that the signal portion 40*a* and conductive blade 40*b* mate together with a desired alignment. Conversely, in another example (not shown in the drawings but analogous to FIG. 5B), an edge of the signal portion 40*a* may be structured with a slot or recess to accommodate therein an edge of the conductive blade 40*b*.

As mentioned above, FIG. 5A illustrates support members between the signal portion 40a and the conductive blade 40b. Support members may be in other locations. For example, one or more support members may form a frame partially or fully around one or more signal portions 40a and one or more conductive blades 40b of a hybrid card 40. As a specific example, a signal portion 40a may contain control circuitry for a power supply and a plurality of conductive blades 40b that serve as supply and return lines for one or more circuits supplied with power from the power supply. The power supply may have an enclosure serving as or containing one or more support members, with the signal portion 40a and the conductive blades 40b mounted within the enclosure such that their insertion edges are exposed along a same edge of the enclosure. The resulting assembly may be a pluggable power supply and may be inserted into a rack or other electronic system such that the insertion edges of the signal portion 40a and the conductive blades 40b may be inserted into a connector inside the system to make signal and power connections.

Figure 5C:
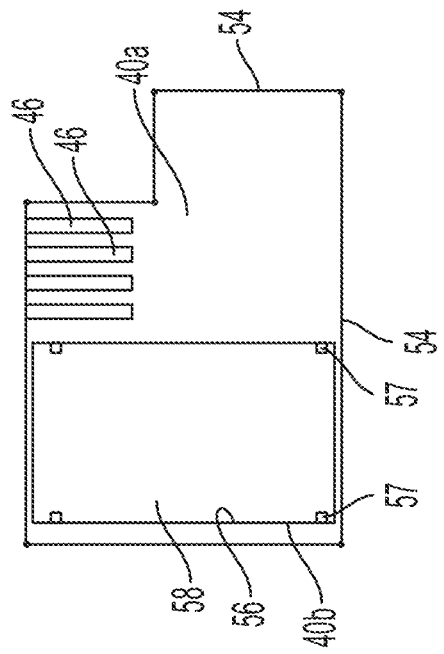

In other examples, the signal portion 40a and the conductive blade 40b may share a common resin board 54. The signal portion 40a may be formed in a part of the resin board 54 and processed as a typical PCB would be processed to form the signal contact-pads 46. As depicted in FIG. 5C, another part of the resin board 54 may support the conductive blade 40b. For example, that portion of the resin board 54 may be clad with a layer 55 of high-conductivity material on one or both sides to form the conductive blade 40b; the cladding layer(s) 55 may be, for example, at least 0.14 mm of Cu or a Cu alloy, or at least 0.5 mm of Cu or a Cu alloy. Alternatively, a conductive blade 40b may be mounted, such as with screws, adhesives or other fasteners to the surface of resin board 54. As a further variation, a region 59 of the resin board 54 may be omitted under the conductive blade 40b, such that the mating edge of the hybrid board, in the power portion 40b may be formed by the edge of the conductive blade 40b. The edge of the conductive blade 40b above the region 59 may be parallel with the body of the conductive blade 40b over the resin board 54, or may be bent into alignment with the edge of signal portion 40a.

Figure 5D:
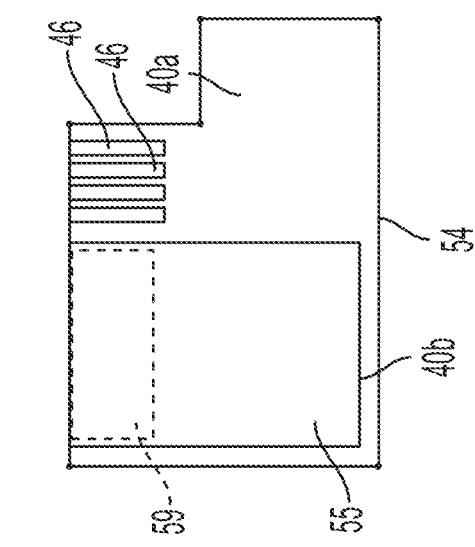

As yet another alternative, as shown in FIG. 5D, the conductive blade 40b may comprise a solid metal plate 58 configured to fit into a cutout or opening 56 of the resin board 54. The cutout 56 may be a surface trench or may be a hole extending through an entire thickness of the resin board 54. Optionally, clips 57, screws adhesives or other fasteners may be used to hold the metal plate 58 in the cutout 56.

As will be appreciated, the signal portion 40a and the power portion 40b may be attached together in other ways. For example, a female-female type edge-socket union may be used to unite the signal and power portions 40a and 40b. The examples presented herein are illustrative and are to be considered non-limiting examples.

The conductive blade 40b in FIGS. 4 and 5A-5D is shown to have a single continuous area on a first side (e.g., a top side, shown in the figures). As will be appreciated, the conductive blade in FIGS. 4 and 5A-5D may also have a second side opposite the first side (e.g., a bottom side, not visible in the figures), which may also have a contact surface along an edge.

In some embodiments, the circuit board assembly may comprise more than one conductive blade. The conductive blades may have contact surfaces on the same or opposite sides of a circuit board assembly. The conductive blades may be held together as an integrated member in which some or all of the conductive blades are separated by insulative layers. Such electrically separated conductive blades may carry power at different voltage levels. When the circuit board assembly includes multiple conductive blades, the blades may have forward edges, adjacent the insertion edge of the circuit board assembly. Some or all of the conductive blades may be set back from the insertion edge of the circuit board assembly, and different ones of the conductive blades may be set back from the insertion edge of the circuit board assembly by different amounts.

Figure 5E:
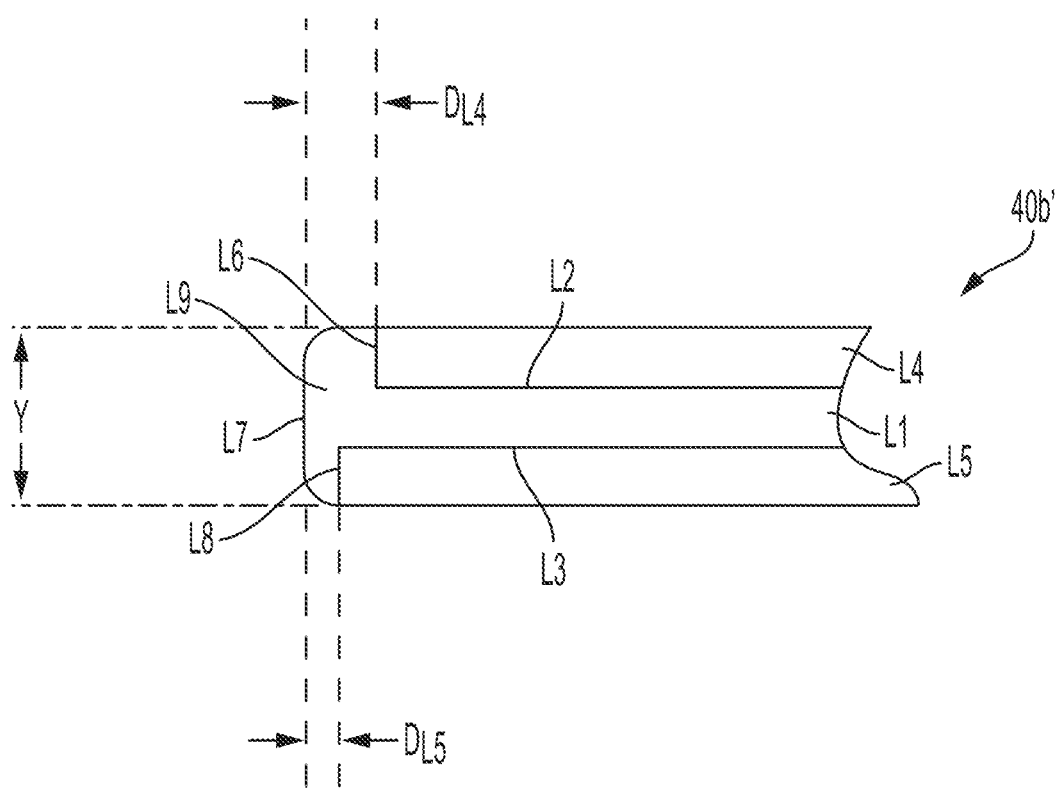
FIG. 5E schematically shows a cross section of a laminated assembly, according to an embodiment of the present technology.

FIG. 5E shows an exemplary cross section of a laminated assembly 40b' of an insulative layer L1 having first and second surfaces L2, L3, a first blade L4 arranged on the first surface L2, and a second blade L5 arranged on the second surface L3. The laminated assembly 40b' depicted in FIG. 5E may, for example, be used instead of the conductive blade 40b of FIG. 5D. The first and second surfaces L2, L3 of the insulative layer L1 may be parallel to the surface of a PCB of the signal portion 40a of FIG. 5D.

The first blade L4 may have a first insertion edge L6 that is set back from an insertion edge L7 of the laminated assembly 40b' by a first distance $D_{L4}$, and the second blade L5 may haves a second insertion edge L8 that is set back from the insertion edge L7 of the laminated assembly 40b' by a second distance $D_{L5}$ that may be different from the first distance $D_{L4}$. The insertion edges L6, L7, L8 may also be referred to as mating edges herein. The first distance $D_{L4}$ may be in a range of 1 mm to 8 mm. The second distance $D_{L5}$ may be in a range of 1 mm to 6 mm. As a specific example, the difference in set-back may be on the order of 2 mm to 5 mm. Such a configuration may be used, for example, in a power supply in which one of the blades L4 and L5 is connected to a supply line of a circuit of the power supply and the other of the blades L4 and L5 is connected to a return line for that circuit. Such a configuration enables advance mating of the supply or return line when the laminated assembly 40b' is inserted into a slot of a connector, by using the second blade L5 for that portion of the circuit to mate first.

The insulative layer L1 may comprise a rigid plastic layer, which may include an endcap L9 that extends over the first and second insertion edges L6, L8 of the first and second blades L4, L5. Alternatively, the insulative layer L1 may comprise an insulative film. For example, the insulative film may have a thickness of about 0.1 mm and the conductive blades L4, L5 may be copper sheets having a thickness of about 1 mm.

In an example embodiment, the laminated assembly 40b' may be incorporated in a power bus bar, such that a portion of the laminated assembly 40b' may extend from a recessed portion of an insulative housing of the power bus bar. The first conductive blade L4 may be a current-in blade that may provide 3000 Watts of power at 48 V, and the second conductive blade L5 may be a current-out blade.

The laminated assembly 40b' may have a total thickness Y in a range of 1 mm to 6.5 mm. A thickness of each of the first and second conductive blades L4, L5 may be in a range of 0.5 mm to 3.5 mm.

Figure 6:
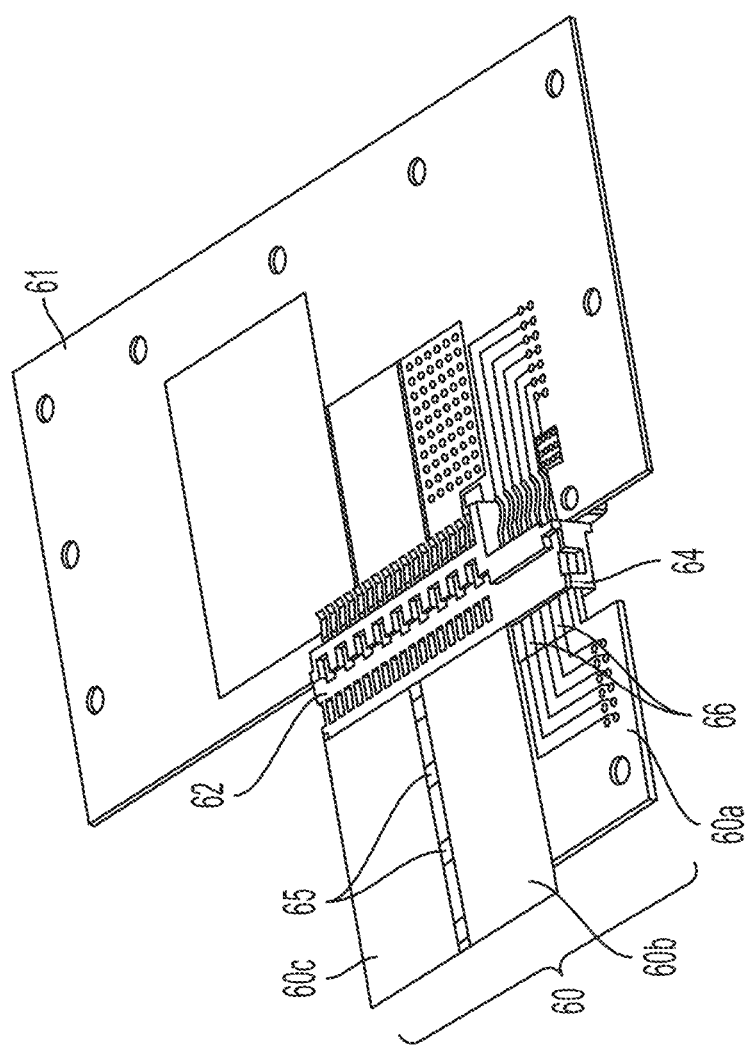
FIG. 6 shows a hybrid card mated with a hybrid connector, according to an embodiment of the present technology.

As evident from the discussion above, it is not a requirement that a hybrid card contain a single blade or a unitary blade. FIG. 6 shows another embodiment of a hybrid card 60 mated with a hybrid connector 62. The hybrid connector 62 may be mounted on a substrate 61. A slot 64 of the hybrid connector 62 may be structured to receive the hybrid card 60 therein.

The hybrid card 60 may have a signal portion 60a and a plurality of power portions 60b, 60c. The signal portion 60a may include signal contact-pads 66 arranged to contact signal terminals of the hybrid connector 62. The power portions 60b, 60c may comprise blades of high-conductivity material. For example, a first conductive blade 60b may serve to carry current from hybrid card 60 to substrate 61, and the second conductive blade 60c may provide a return path carrying current from substrate 61 to hybrid card 60.

The conductive blades 60b, 60c and the signal portion 60a may be joined together to form a single assembly using the techniques discussed above or using other joining techniques known in the art (e.g., insulative clips 65). For example, each of the conductive blades 60b, 60c may be 1.6 mm thick and have a cross-sectional area in a range between 35 mm$^2$ and 50 mm$^2$, and may be able to carry a current greater than 300 amps in a 50 mm$^2$ area, with a maximum temperature increase of 30° C. above an ambient temperature. As will be appreciated, the conductive blades described herein may have a thickness other than 1.6 mm, such as a thickness in a range of from 0.5 mm to 2 mm, or from 1.6 mm to 3 mm, or from 2 mm to 3 mm, or from 3 mm to 4 mm, or from 4 mm to 5 mm.

These blades may be held in parallel using support members that provide electrical insulation between the conductive blades. However, each of the blades 60b, 60c may be electrically connected to the signal portion 60a such that components that respond to control signals can, for example, supply conditioned power through the conductive blades 60b, 60c. Such a configuration may be achieved by attaching the conductive blades 60b, 60c to a surface of a PCB in which the signal portion 60a is implemented. In that configuration, conductive structures within the PCB may make connections between the signal portion 60a and the conductive blades 60b, 60c.

Other structures alternatively or additionally may be used to make connections between the conductive blades 60b, 60c and the signal portion 60a. For example, although FIG. 6 illustrates both the conductive blades 60b, 60c with straight side edges perpendicular to the edge of the hybrid card 60 inserted into the connector 62, either or both of the conductive blades 60b, 60c may have conductive projections extending to the signal portion 60a. In some embodiments, connections between the signal portion 60a and, for example, the conductive blade 60b may be made on one side of hybrid card 60, and/or connections between the signal portion 60a and the conductive blade 60c may be made on the opposite side of the hybrid card 60.

It should be appreciated that, depending on the thickness of the power portion(s) and the signal portion(s) of a hybrid card, as well as the mechanism of attachment of the power portions to the signal portions, the location of contact surfaces on the signal and power portions, relative to the elongated dimension of the slot that receives the edge of the hybrid card, may vary.

FIGS. 7A-7E schematically show examples of elevational views of insertion edges of circuit-board assemblies or hybrid cards having different configurations. These examples are not exhaustive and, as will be appreciated, other configurations may be used for a hybrid card according to other embodiments of the present technology.

Figure 7A:
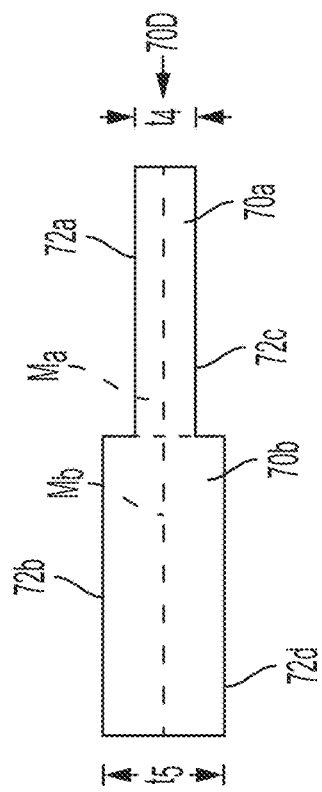
FIGS. 7A, 7B, 7C, 7D, and 7E schematically show examples of elevational views of insertion edges of circuit-board assemblies or hybrid cards having different configurations, according to embodiments of the present technology.

In one example, shown in FIG. 7A, a hybrid card 70A may have a uniform insertion edge. In this example, both a signal portion 70a and a conductive blade 70b of the hybrid card 70A may have a same thickness $t_1$ at their insertion edges. External surfaces 72a, 72b, 72c, 72d of the signal portion 70a and the conductive blade 70b may be aligned, and a midplane $M_a$ of the signal portion 70a may be aligned or coplanar with a midplane $M_b$ of the conductive blade 70b.

Such a configuration may result, for example, from a configuration as shown in FIGS. 5C and 5D in which the power portion is aligned with the signal portion and both are the same thickness. Such a configuration also may result if a conductive blade with a bend is mounted on the same PCB containing the signal portion, as described above in connection with FIG. 5C. In that configuration, the body of the conductive blade may be offset from the signal portion in a direction perpendicular to the edge (or at another angle), but the edge of the conductive blade may bend into alignment with the edge of the signal portion.

Figure 7B:
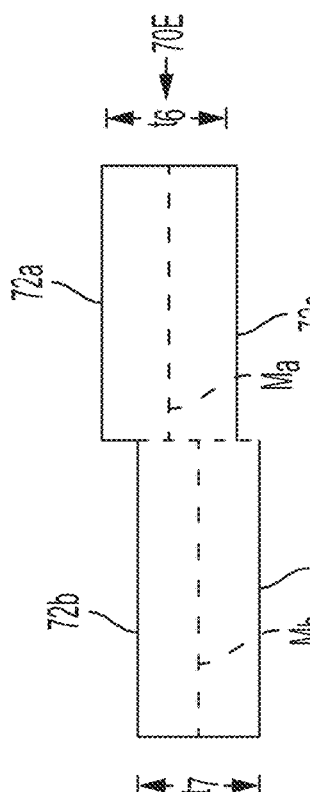

In another example, shown in FIG. 7B, a hybrid card 70B may have a non-uniform insertion edge. In this example, both the signal portion 70a and the conductive blade 70b of the hybrid card 70B may have a same thickness $t_1$ at their insertion edges. However, the midplane $M_a$ of the signal portion 70a may not be aligned with the midplane $M_b$ of the conductive blade 70b for the hybrid card 70B. Such a configuration may result from a configuration as discussed above in connection with FIG. 5C in which a conductive blade is mounted on the same PCB containing the signal portion. The PCB may be implemented without the cutout region 59.

Figure 7C:
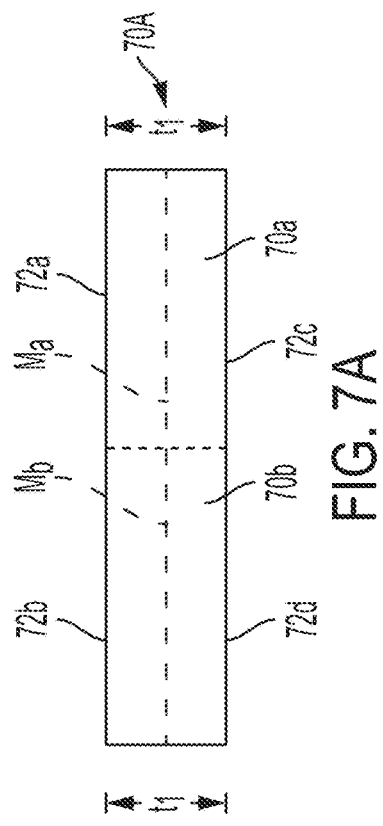

In a further example, shown in FIG. 7C, a hybrid card 70C may have non-uniform insertion edges. In this example, the signal portion 70a may have a thickness $t_2$ at its insertion edge, and the conductive blade 70b may have a different thickness $t_3$ at its insertion edge. Also, the midplane $M_a$ of the signal portion 70a may not be aligned with the midplane $M_b$ of the conductive blade 70b. However, for the hybrid card 70C, an external surface of 72a of the signal portion 70a may be aligned with an external surface 72b of the conductive blade 70b. Such a configuration may result, for example, if the conductive blade and edge of the signal portion have different thicknesses in the examples of FIGS. 5A-5D, or, in the example of FIG. 5C, if the conductive blade is mounted on a top surface of the PCB containing the signal portion.

Figure 7D:
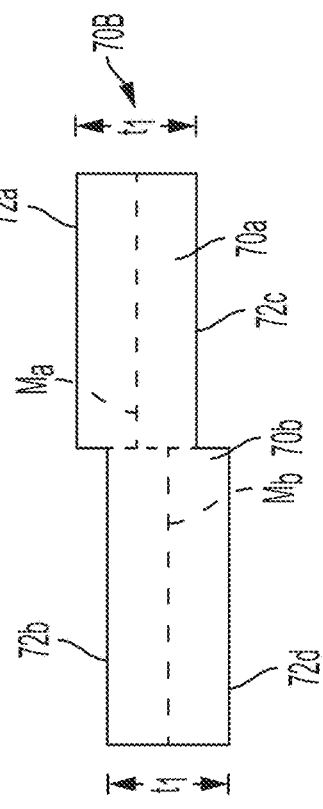

In another example, shown in FIG. 7D, a hybrid card 70D may have non-uniform insertion edges. In this example, the signal portion 70a may have a thickness ta at its insertion edge, and the conductive blade 70b may have a different thickness $t_4$ at its insertion edge. However, the midplane $M_a$ of the signal portion 70a may be aligned with the midplane $M_b$ of the conductive blade 70b. For the hybrid card 70D, no external surface of the signal portion 70a is aligned with an external surface of the conductive blade 70b. Such a configuration may result, for example, if the conductive blade and edge of the signal portion have different thicknesses in the examples of FIGS. 5A-5D, or, in the example of FIG. 5C, if conductive blades are mounted on top and bottom surfaces of the PCB containing the signal portion.

Figure 7E:
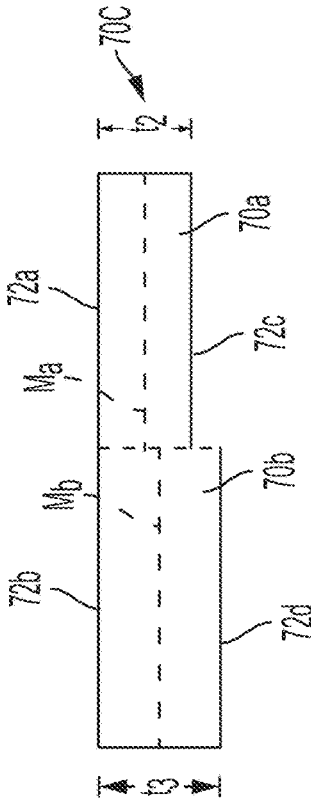

In a further example, shown in FIG. 7E, a hybrid card 70E may have non-uniform insertion edges. In this example, the signal portion 70a may have a thickness to at its insertion edge, and the conductive blade 70b may have a different thickness $t_7$ at its insertion edge. Also, the midplane $M_a$ of the signal portion 70a may not be aligned with the midplane $M_b$ of the conductive blade 70b. For the hybrid card 70E, no external surface of the signal portion 70a is aligned with an external surface of the conductive blade 70b.

FIGS. 8A and 8B are illustrations of perspective views of hybrid connectors 80A, 80B, which may be used to connect to a hybrid card (e.g., the hybrid card 70A). The connector 80A may be a straddle-mount card-edge connector for a parallel board configuration, and the connector of 80B may be a vertically oriented card-edge connector. Aspects of the connectors 80A and 80B may be described collectively below using the reference numeral 80, as both connectors 80A and 80B may have the same mating interface and other components that may be the same.

The connector 80 may comprise an insulative housing 81, a plurality of first conductive terminals 82, and a plurality of second conductive terminals 83. The housing 81 may comprise a slot 84 having a first slot portion 84a and a second slot portion 84b. The first conductive terminals 82 may be disposed in the first slot portion 84a, and the second conductive terminals 83 may be disposed in the second slot portion 84b. For example, the first conductive terminals 82 may be arranged in rows on opposite sides of the first slot portion 84a, and the second conductive terminals may be arranged in rows on opposite sides of the second slot portion 84b.

The first conductive terminals 82 may be signal terminals and may be configured to carry electrical signals. The second conductive terminals 83 may be power terminals and may be configured to carry a relatively large amount of current at a relatively high voltage. For example, each of the second conductive terminals 83 may be configured to carry up to 40 A. In another example, each of the second conductive terminals 83 may be configured to carry up to 50 A at up to 400 V. The first conductive terminals 82 may be electrically isolated from the second conductive terminals 83. Dimensions of the first conductive terminals 82 may be different from dimensions of the second conductive terminals 83. Structural configurations of a power terminal according to aspects of the present technology, usable as one of the second conductive terminals 83, are discussed in more detail below.

The slot 84 may be configured to receive a hybrid card (e.g., 70A). For example, the first slot portion 84a may be configured to receive an edge of a circuit board (e.g., 70a) of the hybrid card inserted therein. The first conductive terminals 82 may be arranged in the first slot portion 84a to engage with and physically contact signal contact-pads disposed on the circuit board when the hybrid card is in a mated state with the connector 80. The second slot portion 84b may be configured to receive an edge of a conductive blade (e.g., 70b) of the hybrid card inserted therein. The second conductive terminals 83 may be arranged in the second slot portion 84b to engage with and physically contact one or more conductive blades when the hybrid card is mated with the connector 80.

Figure 9:
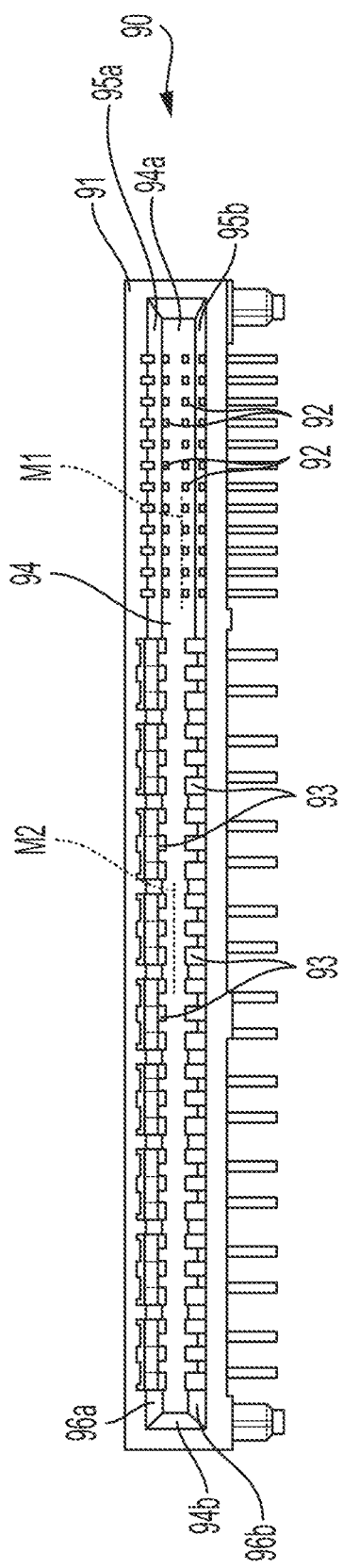
FIG. 9 shows a plan view of a connection face of a hybrid connector, according to an embodiment of the present technology.
Figure 10:
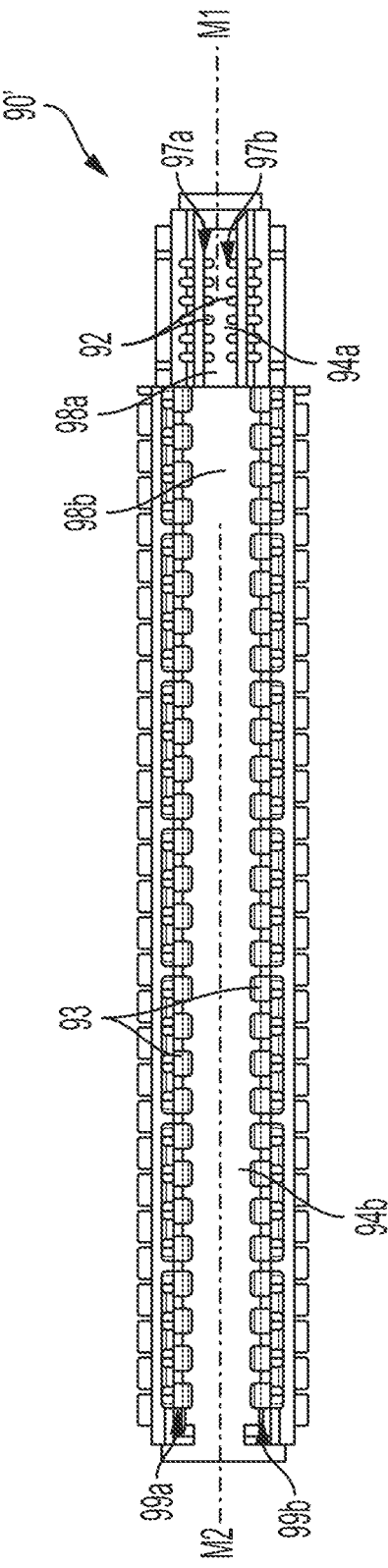
FIG. 10 shows a plan view of a connection face of a hybrid connector, according to an embodiment of the present technology.

FIGS. 9 and 10 show plan views of a connection face of hybrid connectors 90, 90'. The connector 90 may comprise an insulative housing 91 having a slot 94. The slot 94 may comprise first and second slot portions 94a, 94b. The first slot portion 94a may comprise first and second internal surfaces 95a, 95b, and the second slot portion 94b may comprise third and fourth internal surfaces 96a, 96b.

First conductive terminals 92 may be arranged in a first array 97a on the first internal surface 95a and a second array 97b on the second internal surface 95b. The first array 97a may face the second array 97b such that a first card-receiving space 98a may be formed between the first and second arrays 97a, 97b.

Similarly, second conductive terminals 93 may be arranged in a third array 99a on the third internal surface 96a and a fourth array 99b on the fourth internal surface 96b. The third array 99a may face the fourth array 99b such that a second card-receiving space 98b may be formed between the third and fourth arrays 99a, 99b.

As shown in FIG. 10, the first card-receiving space 98a may comprises a first mid-plane M1 located between the first and second arrays 97a, 97b and equidistant from the first array 97a and the second array 97b. The second card-receiving space may comprise a second mid-plane M2 located between the third and fourth arrays 99a, 99b and equidistant from the third array 99a and the fourth array 99b.

The first mid-plane M1 and the second mid-plane M2 may have a predetermined relationship relative to each other. For example, the first mid-plane M1 may be coplanar with the second mid-plane M2; this is depicted schematically in FIGS. 9 and 10. In another example, the first mid-plane M1 may not be coplanar with the second mid-plane M2; this is depicted schematically in FIGS. 11 and 12.

As will be appreciated, the first and second mid-planes M1, M2 may be coplanar, or may be parallel, or may be staggered, or may be non-parallel and non-coplanar, etc.

A distance between the first and second internal surfaces 95a, 95b of the first slot portion 94a may be designated a height H1 of the first slot portion 94a. A distance between the third and fourth internal surfaces 96a, 96b of the second slot portion 94b may be designed a height H2 of the second slot portion 94b. The height H1 of the first slot portion 94a may be equal to or different from the height H2 of the second slot portion 94b. Even though the height H1 of the first slot portion 94a may be the same as the height H2 of the second slot portion 94b, a height of the first card-receiving space 98a may be different from a height of the second card-receiving space 98b due to a size difference between the first conductive terminals 92 and the second conductive terminals 93. For example, as depicted schematically in FIG. 11, a distance between a plane P1 corresponding to contact surfaces of the first array 97a and a plane P2 corresponding to contact surfaces of the second array 97b may be different from a distance between a plane P3 corresponding to contact surfaces of the third array 99a and a plane P4 corresponding to contact surfaces of the fourth array 99b.

Figure 12:
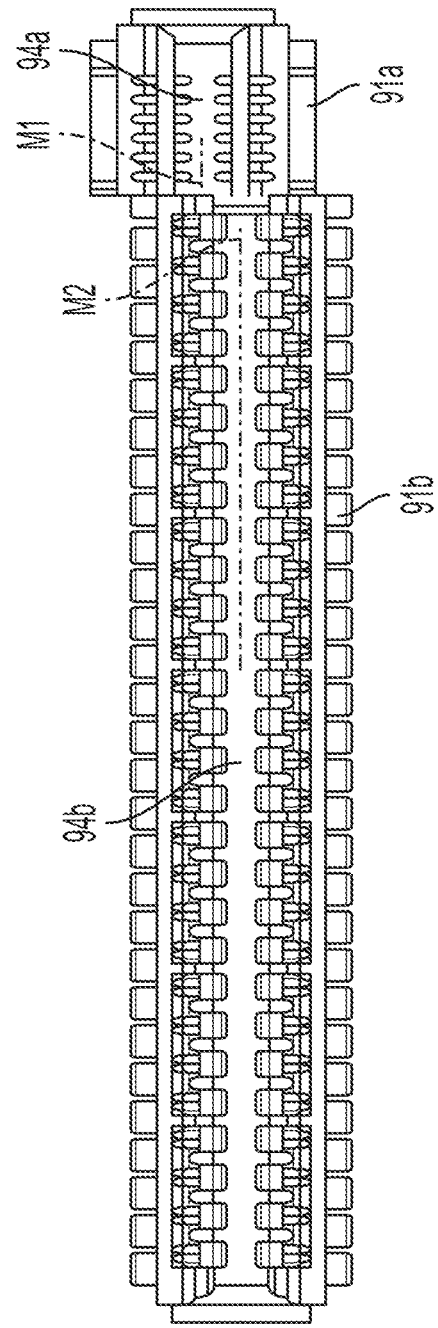
FIG. 12 shows a plan view of a connection face of a hybrid connector, according to an embodiment of the present technology.

The housing 91 may comprise a first housing portion 91a, in which the first slot portion 94a is disposed, and a second housing portion 91b in which the second slot portion 94b is disposed. The first and second housing portions 91a, 91b may be integrally formed as a single unit or may be connected together to form a single unit, as schematically depicted in FIG. 12.

Figure 11:
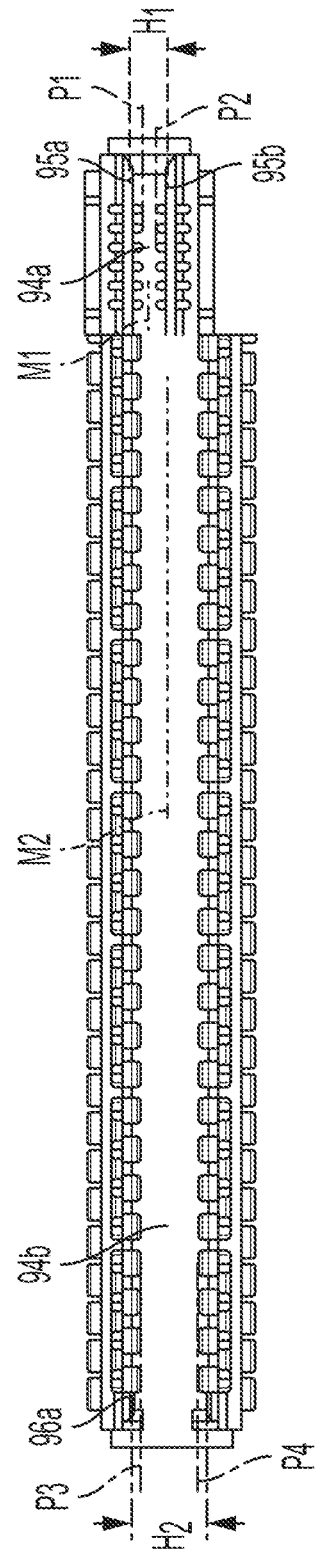
FIG. 11 shows a plan view of a connection face of a hybrid connector, according to an embodiment of the present technology.

Connectors to receive hybrid cards of the various configurations may be constructed, such as are schematically illustrated in FIG. 7A-7E. A connector as illustrated in FIG. 9 may be usable with the topology of FIG. 7A. A connector as illustrated in FIG. 10 may be usable with the topology of FIG. 7D. A connector as illustrated in FIG. 11 may be usable with the topology of FIG. 7C. A connector as illustrated in FIG. 12 may be usable with the topology of FIG. 7B. Other connector configurations may be used with other topologies.

In FIGS. 9-12, the hybrid connectors in the drawings are shown to have two slot portions to accommodate a hybrid card: one slot portion to accommodate a signal portion of the hybrid card and another slot portion to accommodate a power portion of the hybrid card. In other embodiments, hybrid connectors may have more than two slot portions to accommodate, for example, a hybrid card having more than one signal portion and/or more than one power portion. Though, it should be appreciated that there is not a requirement for a one to one relationship between signal portions and/or power portions of a hybrid card and slot portions in a connector, as more than one power portion, having the same thickness and midplane may fit within the same slot portion. Likewise, more than one signal portion may fit within the same slot portion.

Figure 13B:
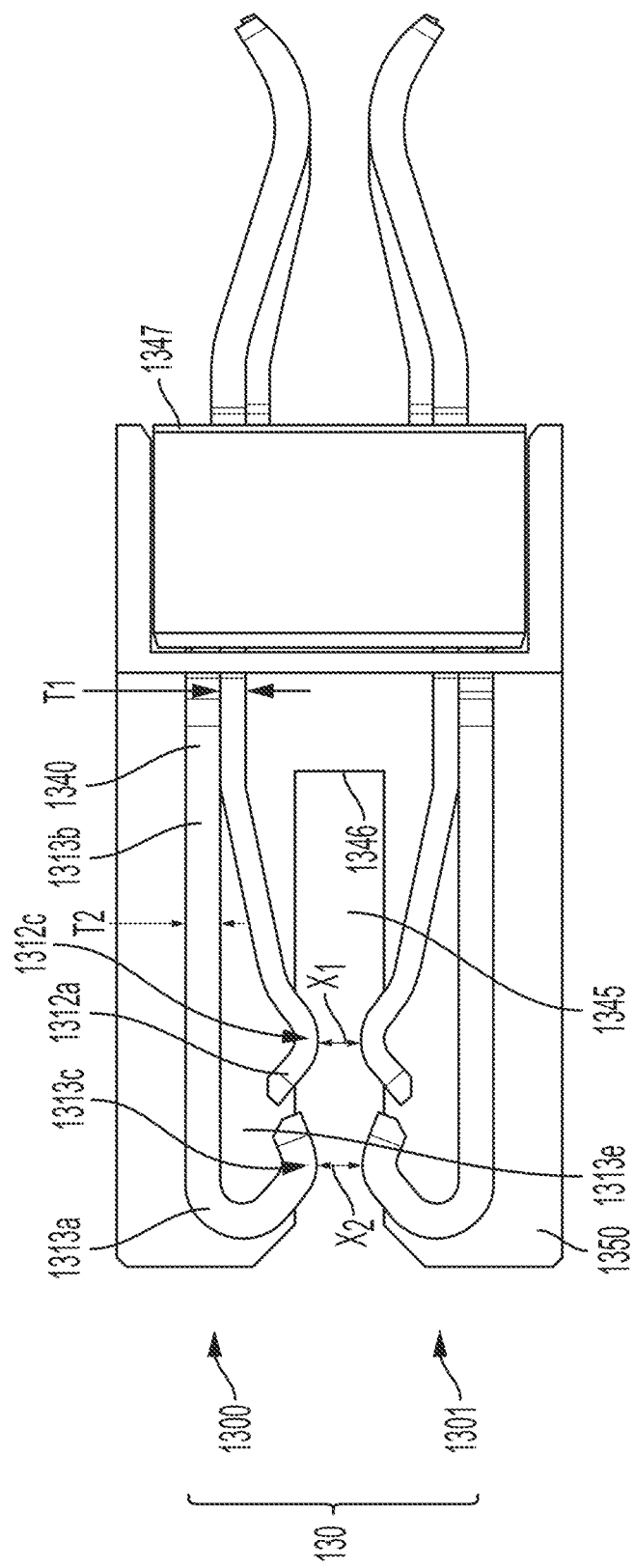
FIG. 13B shows a cross-sectional view of a power terminal assembly, including two power terminals as in FIG. 13A (or FIG. 13A') within a housing, according to an embodiment of the present technology.

The hybrid cards, as described above, may be used with power terminals that carry a large amount of current. FIG. 13A depicts a top plan view of a power terminal 1300 that may be used as one of the second conductive terminals 83, 93, discussed above. The power terminal 1300 may have multiple groups of fingers, here shown as a first plurality of first fingers 1312 having first ends 1312*a* spaced apart from each other and second ends 1312*b* connected to each other. The power terminal 1300 also may comprise a second plurality of second fingers 1313 having first ends 1313*a* spaced apart from each other and second ends 1313*b* (see FIG. 13B) connected to each other. The first ends 1313*a* of the second fingers 1313 may be spaced apart from the first ends 1312*a* of the first fingers 1312. The second ends 1312*b* of the first fingers 1312 may be in contact with the second ends 1313*b* of the second fingers 1313 at a joint region 1340. The first ends 1312*a*, 1313*a* may be mating ends or mating portions.

The centers of the mating ends of the fingers in two or more of the groups may be offset with respect to each other in a direction perpendicular to a direction of elongation of the fingers. In the example of FIG. 13A, the centers of the first ends 1312*a* are offset with respect to the centers of the first ends 1313*a*. Such a configuration may distribute wear of the mating edges of the conductive blades of a hybrid card. Distributing wear reduces the likelihood of a contact failure after repeated use, and may be particularly advantageous in configurations in which the fingers have dimples on their contact surfaces to provide lower contact resistance or a greater ability to wipe away oxide layers as a result of higher contact pressure provided by the dimples.

The first plurality may be greater in number than the second plurality, i.e., a number of the first fingers 1312 may be greater than a number of the second fingers 1313. For example, there may be three of the first fingers 1312 and two of the second fingers 1313, as shown in FIG. 13A. Optionally, as shown in FIG. 13A', a power terminal 1300' may comprise four of the first fingers 1312 and three of the second fingers 1313. Having more first fingers enables the first fingers to be narrower than the second fingers. Such a configuration may provide multiple contact fingers that have substantially the same contact force, even though the first fingers are shorter than the second fingers.

Figure 13D:
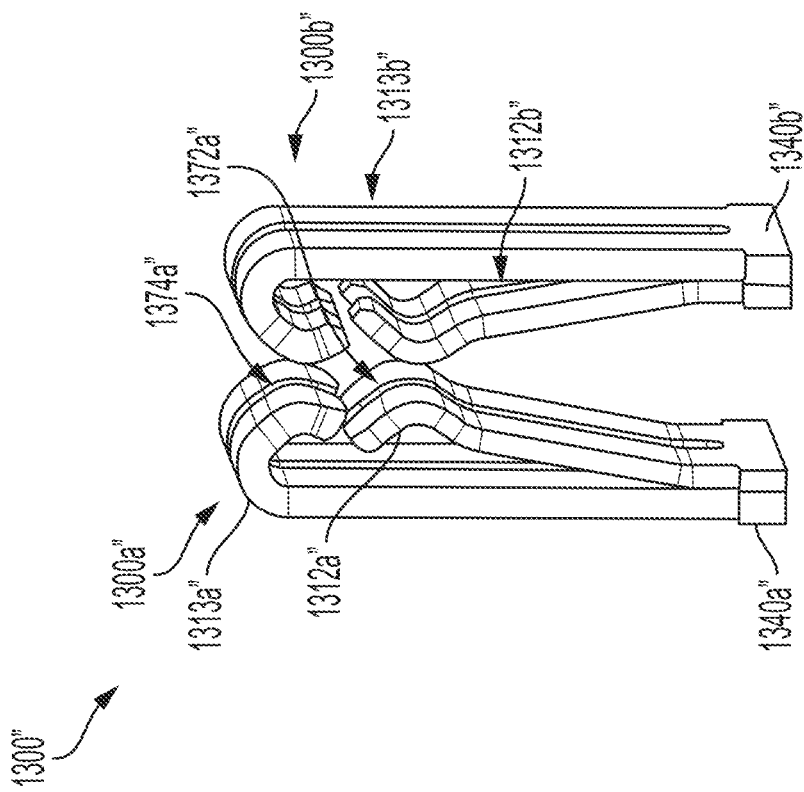
FIG. 13D is a perspective view showing a mating portion of a power terminal, according to an embodiment of the present technology.

FIG. 13D, however, shows a configuration in which there are two first fingers and two second fingers. FIG. 13D shows mating portions of two power terminals 1300*a*" and 1300*b*", configured for mounting within a connector housing on opposing surfaces of a slot to receive a conductive blade inserted into the slot between them. Outer fingers 1313*a*", 1313*b*" are joined to inner fingers 1312*a*", 1312*b*" at joints 1340*a*", 1340*b*", respectively. In this example, contact surfaces 1374*a*" of the outer fingers align, in a direction perpendicular to an edge of a hybrid card to which the fingers may mate, with contact surfaces 1372*a*" of the inner fingers. As will be appreciated, the first plurality and the second plurality may have values different than those of the power terminals 1300, 1300', 1300" shown in FIGS. 13A, 13D, and 13A'.

Figure 13C:
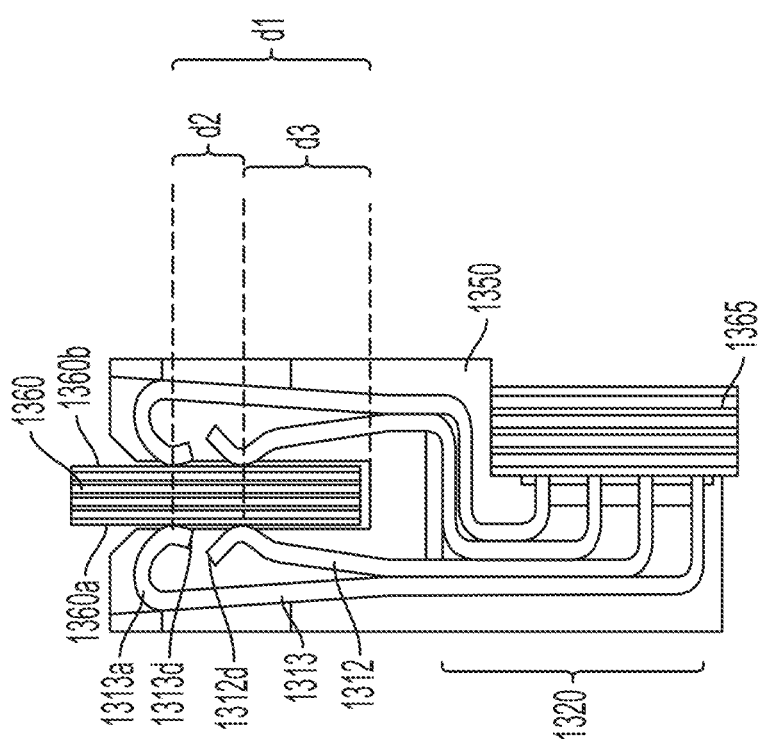
FIG. 13C shows a cross-sectional view of a power terminal assembly with a mounting portion configured for a right angle connector, according to an embodiment of the present technology.

The power terminal 1300 also may comprise a mounting end 1320 configured for attachment to a substrate 1365 (see FIG. 13C). As will be appreciated, mounting ends may be configured to support a desired board configuration. The mounting end 1320 of the power terminal 1300 or 1300', for example, may have surface mount solder tails, which may be suitable for a connector as shown in FIG. 2C. The mounting end 1320 of the power terminals in FIG. 13C, for example, may have press-fit solder tails, which may be suitable for a connector as shown in FIG. 2B. The power terminals shown in FIG. 13D are illustrated without their mounting ends shown; the mounting ends may have any suitable configuration.

The first ends 1312*a* of the first fingers 1312 may have first contact points 1312*c* that may be configured to contact a first side of a card. For example, the contact points 1312*c* may contact a contact surface of a conductive blade or power portion of a hybrid card. The contact points may be on convex surfaces that may be formed in the fingers. Those surfaces may be plated or treated to reduce resistance of a contact. In some embodiments, a contact point may extend across the fingers. In other embodiments, a dimple may be formed in the fingers to provide a smaller contact point.

The first ends 1313*a* of the second fingers 1313 may have second contact points 1313*c* that may be configured to contact the first side of the card. The first contact points 1312*c* may contact the first side of the card at different locations than the second contact points 1313*c*.

A length of the first fingers 1312 may be less than a length of the second fingers 1313. Such a configuration enables both a large number of contact points and a low bulk resistance of the power terminal through the use of multiple sheets of metal to form the power terminal. Two sheets of metal are shown joined at the joint region 1340 in FIG. 13A and at a joint region 1340*a*" and 1340*b*" in FIG. 13D. In the embodiment of FIG. 13C, terminals on opposite sides of a slot are each stamped from two sheets of metal, which are then joined, resulting in four sheets of metal being joined.

The joined sheets of metal may have different thicknesses in some embodiments. A thickness T1 of the first fingers 1312 may be less than a thickness T2 of the second fingers 1313, for example. For example, T1 may be between 0.15 mm to 0.25 mm less than T2.

As shown in FIG. 13B, at least one of the second fingers 1313 may comprise an elongate straight main body and a hook-shaped first end 1313*a* connected to the straight main body. The second contact point 1313*c* of each of the at least one of the second fingers 1313 may be on the hook-shaped first end 1313*a*. For example, the second contact point 1313*c* may protrude from the hook-shaped first end 1313*a*.

FIG. 13B shows a terminal assembly with two power terminals having mating portions as shown in FIG. 13A, but having mounting portions configured for use in a right-angle connector. In the illustrated embodiment, an assembly 130 of power terminals 1300, 1301 are held within a base 1347 so that the power terminals 1300, 1301 are aligned with opposite walls of a slot 1345 when the terminal assembly is inserted into an insulative housing 1350. The base 1347 may be formed in an insert molding operation or in another suitable way. FIG. 13B shows a cross section through two opposing power terminals 1300, 1301 in one terminal assembly 130. It should be appreciated that a terminal assembly may include more or fewer than two terminals, or that alternative constructions techniques may be used, such as inserting power terminals into a connector housing without forming the terminals into terminal assemblies.

As shown in FIG. 13B, at least one of the first fingers 1312 may comprise an elongate main body having at least one bend and a first end 1312*a* connected to the main body. The first end 1312*a* is shown with a curved portion. The first contact point 1312*c* of each of the at least one of the first fingers 1312 may be on the curved portion of first end 1312*a*. For example, the first contact point 1312*c* may protrude from the curved first end 1312*a*. In this example, the curved portion forms the distal end of the first finger.

The hook-shaped first end 1313a of the at least one of the second fingers 1313 may be hooked such that there is an opening 1313e facing the joint region 1340. As shown in FIG. 13B, a concave portion of the hook-shaped first end 1313a may be structured such that the opening 1313e faces joint region 1340. As will be appreciated, although the power terminal 1300 may be described herein to have two layers of fingers stacked on each other, variations of the power terminal 1300 may have three or four or more layers of fingers.

FIG. 13C is a cross section through opposing power terminals in a right angle connector. The power terminals of FIG. 13C, therefore, have mounting portions configured differently than in FIG. 13A, but the mating portion may be the same. As shown in FIG. 13C, a minimum distance from the straight main body of the second fingers 1313 to a tip 1313d of the hook-shaped first end 1313a connected to the straight main body is greater than a minimum distance from the straight main body of the second fingers 1313 to a tip 1312d of the curve-shaped first end 1312a of the at least one of the first fingers 1312. With such a structure, the opening 1313e facing the joint region 1340 faces the tip 1312d of the curved-shape first end 1312a of the at least one of the first fingers 1312.

As shown in FIG. 13A, the first fingers 1312 may be disposed in a first row in a row direction R, which is parallel to the elongated direction of the slot 1345 into which an edge of a PCB will be inserted. The second fingers 1313 may be disposed in a second row in a second direction parallel to the row direction R. That is, the first row may be parallel to the second row. A width W1 of at least one of the first fingers in a direction parallel to the row direction is less than a width W2 of at least one of the second fingers in a direction parallel to the row direction.

A connector incorporating the power terminal 1300 may comprise the insulative housing 1350 in which the first fingers 1312 and the second fingers 1313 are disposed. The housing 1350 may comprise at least one opening exposing the first and second contact points 1312c, 1313c and a slot 1345 configured to receive an edge of a card 1360 therein. The slot 1345 may have a closed end 1346 configured to limit an insertion distance of the card into the slot 1345.

Upon insertion of the card 1360 into the slot 1345, contact points of the power terminal 1300 will wipe over a power pad on a surface of the card 1360. For the longer, second fingers 1313, a wipe length is a distance d1. The distance d1, between the second contact points 1313c and the closed end 1346 of the slot 1345, may be in a range between 7.5 mm to 9.5 mm.

The wipe length for the shorter, inner (first) finger 1312 is shown as d3. The distance d3, between the first contact points 1312c and the closed end 1346 of the slot 1345, may be in a range between 4.5 mm to 6.5 mm.

The wipe length d3 may be less than the wipe length d1 by d2. The distance d2, between one of the first contact points 1312c and a nearest one of the second contact points 1313c, may be in a range between 1.5 mm to 3.5 mm. The inventors have recognized and appreciated that making d2 smaller increases the wipe length for the inner finger 1312, which in turn leads to less contact resistance, as wiping can remove oxide on the contact surfaces that might otherwise increase contact resistance.

As mentioned above, the power terminals 1300, 1301 may be a first power terminal 1300 and a second power terminal 1301 of a power terminal assembly 130, as schematically shown in FIG. 13B. One or more such power terminal assemblies may be inserted in the connector housing 1350 or otherwise held together so as to form a power portion of a connector. The second power terminal 1301 may have a same structure as the first power terminal 1300, and therefore details of this structure will not be repeated. The first and second power terminals 1300, 1301 may be arranged such that contact points of the first power terminal 1300 face the contact points of the second power terminal 1301.

More specifically, for the first power terminal 1300, the first ends 1312a of the first fingers 1312 may have first contact points 1312c that are configured to contact a first side 1360a of a card 1360, and the first ends 1313a of the second fingers 1313 may have second contact points 1313c configured to contact the first side 1360a of the card 1360, with the first contact points 1312c being different from the second contact points 1313c. For the second power terminal 1301, the first ends 1312a of the first fingers 1312 may have first contact points 1312c configured to contact a second side 1360b of the card 1360, and the first ends 1313a of the second fingers 1313 may have second contact points 1313c configured to contact the second side 1360b of the card 1360, with the first contact points 1312c being different from the second contact points 1313c. A portion of each of the first and second power terminals 1300, 1301 may be disposed in the housing 1350 such that the first and second contact points 1312c, 1313c of the second power terminal 1301 face the first and second contact points 1312c, 1313c of the first power terminal 1300 across a gap.

The first contact points 1312c of the first fingers 1312 of the first power terminal 1300 and the first contact points of the first fingers of the second power terminal 1301 may be separated by a distance $X_1$. The second contact points 1313c of the second fingers 1313 of the first power terminal 1300 and the second contact points of the second fingers of the second power terminal 1301 may be separated by a distance $X_2$. $X_1$ may be in a range of 0.75 mm to 0.95 mm, and $X_2$ may be in a range of 0.80 mm to 1.00 mm. Optionally, $X_1$ may be in a range of 0.82 mm to 0.86 mm, and $X_2$ may be in a range of 0.88 mm to 0.92 mm.

In the alternative embodiment illustrated in the perspective view of FIG. 13D, the power terminals 1300a", 1300b" may be inserted into a housing, with or without first being held in a base to form an assembly. As with the other power terminals described above, the power terminals 1300a", 1300b" of FIG. 13D may be formed of multiple layers. Here two such layers are shown, resulting in power terminals with outer fingers 1313a", 1313b" and inner fingers 1312a", 1321b". In the illustrated embodiment, there are the same number of inner and outer fingers, and the contact points of the inner and outer fingers are aligned in a direction of insertion of a card to mate with the terminals.

The power terminals 1300a", 1300b" illustrated in FIG. 13D have longer fingers and shorter fingers. The longer fingers have hooked ends, such that distal tips of the longer fingers curve back towards distal tips of the shorter fingers. Contact points of the longer fingers are disposed on portions that curl back towards the shorter fingers, such that the wipe distance for both the longer and shorter fingers is similar, which can be desirable. Moreover, such a configuration is resistant to mechanical stubbing because the distal tips of the longer fingers point away from the insertion direction of a card, and the distal tips of the shorter fingers are guarded by the hooked portions of the longer fingers.

Figure 14A:
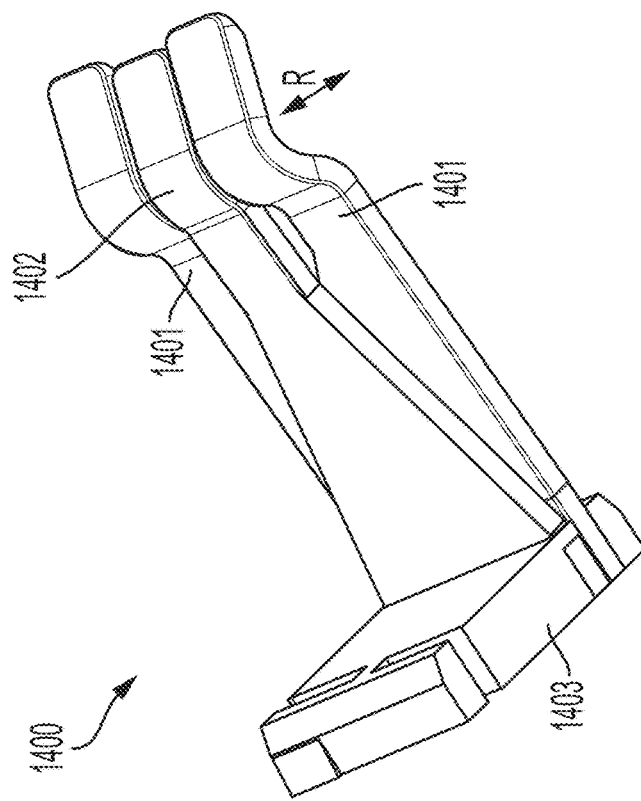
FIGS. 14A and 14A' show a perspective view of a power terminal, according to an embodiment of the present technology.
Figure 14A:
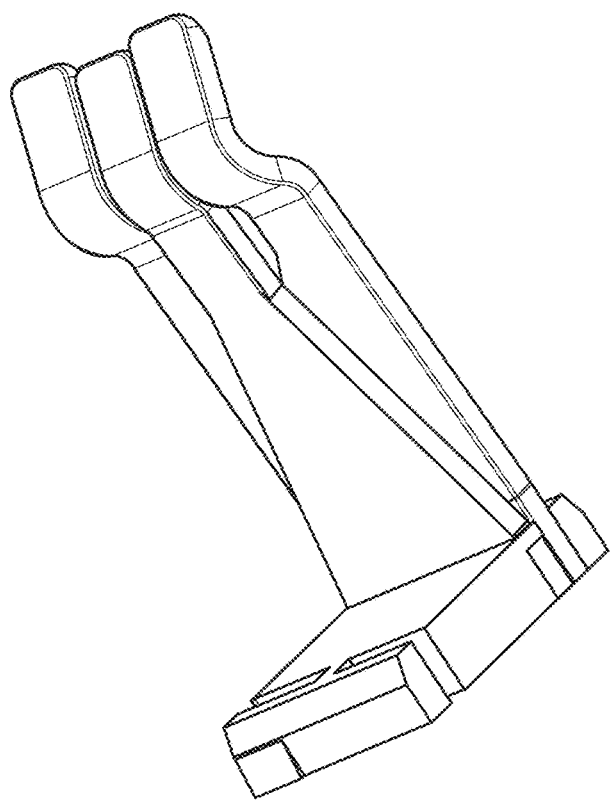
Figure 14B:
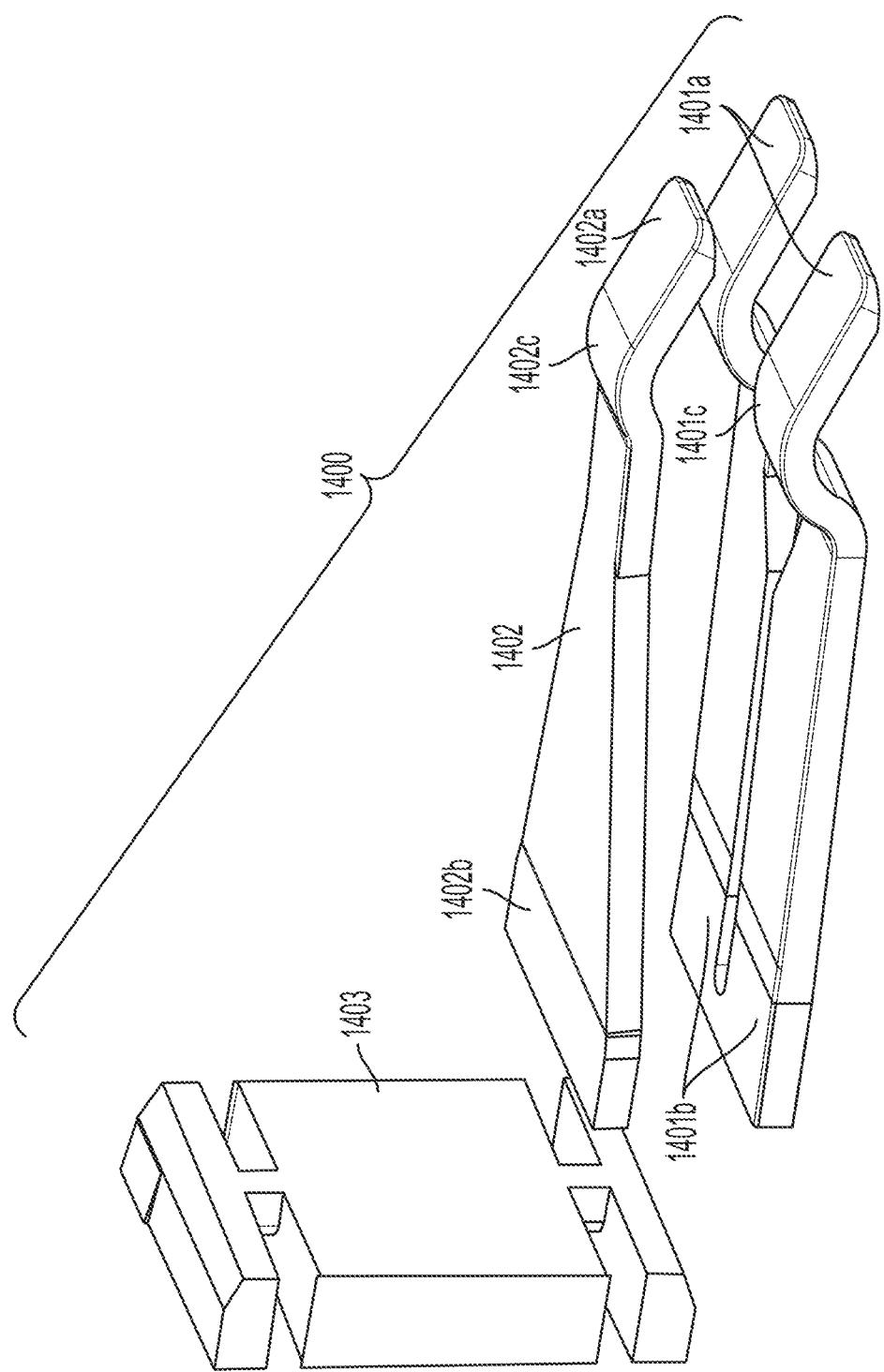
FIG. 14B shows an exploded view of the power terminal of FIG. 14A.
Figure 14C:
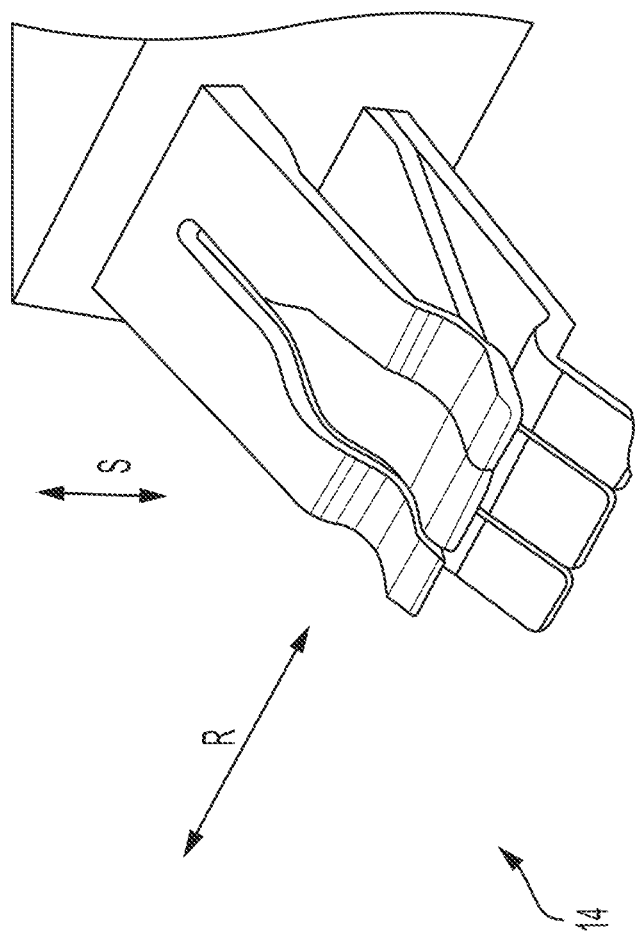
FIG. 14C shows a perspective view of a power terminal assembly, according to an embodiment of the present technology.
Figure 15E:
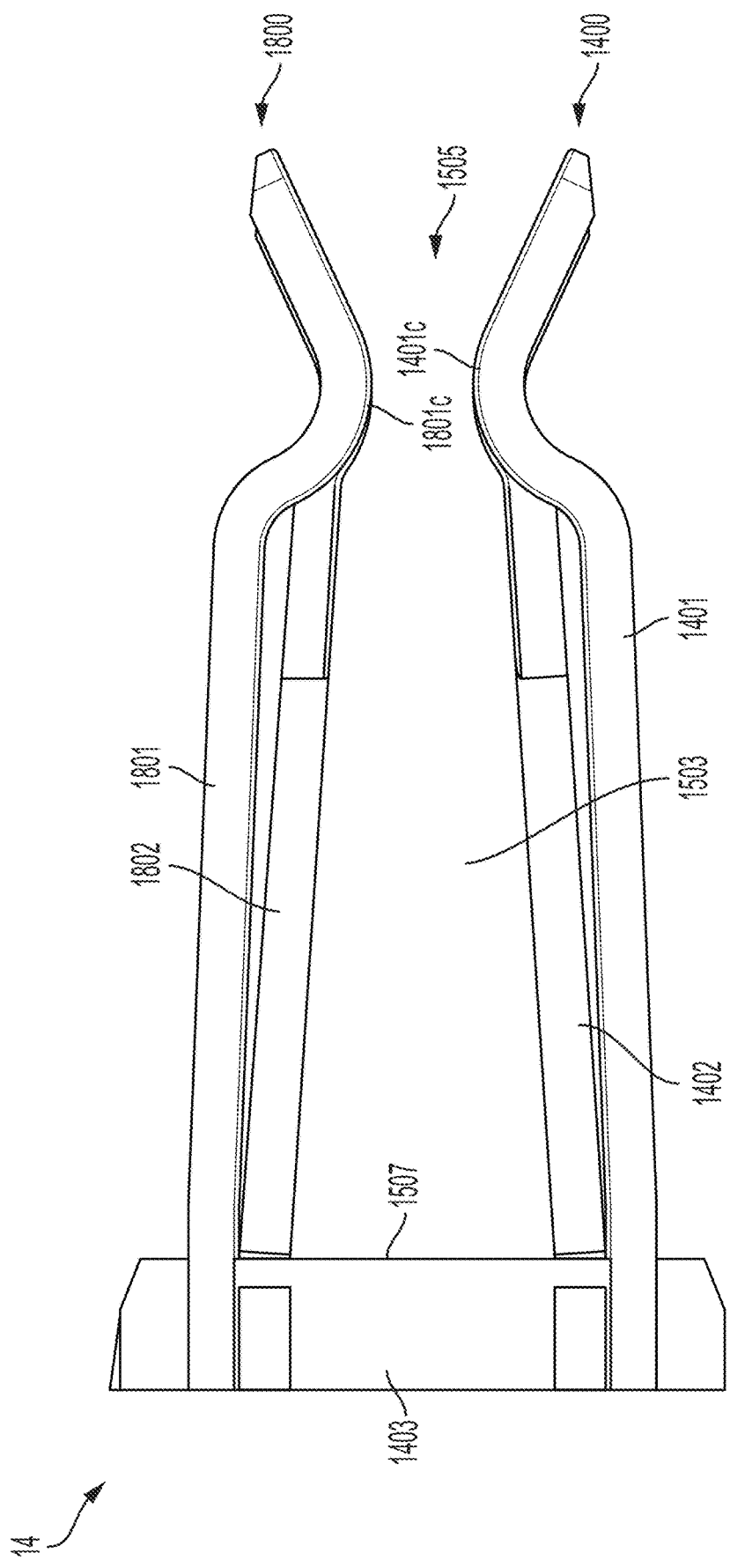
FIG. 15E shows a side plan view of the power terminal assembly of FIGS. 15A and 15B.

FIG. 14A is a perspective view of an alternative embodiment of a power terminal 1400, and FIG. 14B shows an exploded view of the power terminal 1400 of FIG. 14A. The arrangement of the power terminal 1400 may facilitate inspection of a contact gap between the two rows of fingers, and also may provide a good wipe length compared with other arrangements. FIGS. 15A and 15B show top and bottom plan views of a power terminal assembly 14, which may have a pair of power terminals facing each other, such as the first and second power terminals 1400, 1800 discussed below. FIGS. 15C and 15D show top and bottom perspective views of the mating portion of the power terminal assembly 14. As with FIGS. 14A and 14B, mounting portions of the assembly 14 are not shown, for the sake of simplicity. FIG. 15E shows a side elevational view of a mating portion of the power terminal assembly 14. Three-dimensional renderings of the line drawings in FIGS. 14A and 15A-15D are shown in FIGS. 14A' and 15A'-15D', to illustrate more clearly curvatures and other features that may not be easily seen in the line drawings.

The power terminal 1400 may be constructed from two or more sheets into which fingers are formed, e.g., by stamping. The sheets may be laid one on top of the other such that contact points on each of the fingers faces the same direction for contacting a power pad on an edge of a card inserted into a connector including the power terminal 1400. In the illustrated embodiment, the power terminal 1400 may comprise a pair of first fingers 1401, a second finger 1402, and a base 1403 to which the first and second fingers 1401, 1402 are attached. The first fingers 1401 may comprise first ends 1401a spaced apart from each other and second ends 1401b connected to each other. The second finger 1402 may comprise a first end 1402a and a second end 1402b.

The base 1403 may be configured to hold the second ends 1401b, 1402b of the first and second fingers 1401, 1402. The base 1403, for example, may be an insulator molded around portions of the first and second fingers 1401, 1402 of the terminal 140. The second ends 1401b, 1402b of the first and second fingers 1401, 1402 may be electrically and/or mechanically connected, such as by welding or soldering, before they are inserted or molded into the base 1403. Alternatively or additionally, the second ends 1401b, 1402b of the first and second fingers 1401, 1402 may be electrically connected as a result of being held together in the base 1403. FIG. 14A does not show a mounting portion of the terminal 1400, but a mounting portion, in a configuration as described above or in any other suitable configuration, may extend from the base 1403. An opposing power terminal 1800 may be held in the same base 1403, opposite the power terminal 1400, to form a power terminal assembly 14 (see FIGS. 14C and 15E), discussed below. Such assemblies may be inserted into a connector housing forming a power portion of a hybrid connector, or power terminals 1400 may be inserted directly into a connector housing, as described above in connection with other embodiments.

As will be appreciated from the discussion above, the base 1403 may be molded around the second ends 1401b, 1402b of the first and second fingers 1401, 1402, and therefore the base 1403 and the second ends 1401b, 1402b are depicted schematically in the figures and may be shaped differently than depicted in the figures.

The first ends 1401a, 1402a of the first and second fingers 1401, 1402 may each have a contact surface 1401c, 1402c configured to engage with and physically contact a PCB or a conductive blade (not shown). The first end 1402a of the second finger 1402 may be positioned in a space between the first ends 1401a of the first fingers 1401 such that the contact surfaces 1401c, 1402c of the first and second fingers 1401, 1402 may be coplanar and aligned in a row direction R (see FIG. 14C). The second ends 1401b of the first fingers 1401 may be aligned with the second end 1402b of the second finger 1402 in a second direction S different from the row direction R. For example, the second end 1402b of the second finger 1402 may be stacked on the second ends 1401b of the first fingers 1401.

The power terminal 1400 may be a first power terminal 1400 of the power terminal assembly 14, which may also comprise a second power terminal 1800 in addition to the first power terminal 1400, as shown in FIGS. 15C-15E. The second power terminal 1800 may have a same structure as the first power terminal 1400, and therefore details of this structure will not be repeated (reference numerals designated 18 ## for the second power terminal 1800 may be used for features analogous to the reference numerals 14 ## used for the first power terminal 1400). The first and second power terminals 1400, 1800 may be attached to the base 1403 such that the first power terminal 1400 faces the second power terminal 1800. The base 1403 may be an electrically insulative base or an electrically conductive base.

Similar to a connector formed with a power terminal, such as 1300 as described above, the contact surfaces 1401c, 1402c of the first power terminal 1400 may be configured to face corresponding contact surfaces 1801c, 1802c of the second power terminal 1800 across a gap 1503. A card-receiving slot 1505 may be formed by external portions of the second fingers 1402, 1802 of the first and second power terminals 1400, 1800 that face each other across the gap 1503, the contact surfaces 1401c, 1402c, 1801c, 1802c of the first and second power terminals 1400, 1800 that face each other across the gap 1503, and a lateral portion 1507 of the base 1403 between the first and second power terminals 1400, 1800.

The lateral portion 1507 of the base 1403 may be configured to limit an insertion distance of a PCB or a conductive blade inserted into the card-receiving slot 1505. The contact surfaces 1401c, 1402c of the first power terminal 1400 may be configured to contact a first side of the PCB or conductive blade, and the contact surfaces 1801c, 1802c of the second power terminal 1800 may be configured to contact a second side of the PCB or conductive blade.

Figure 16B:
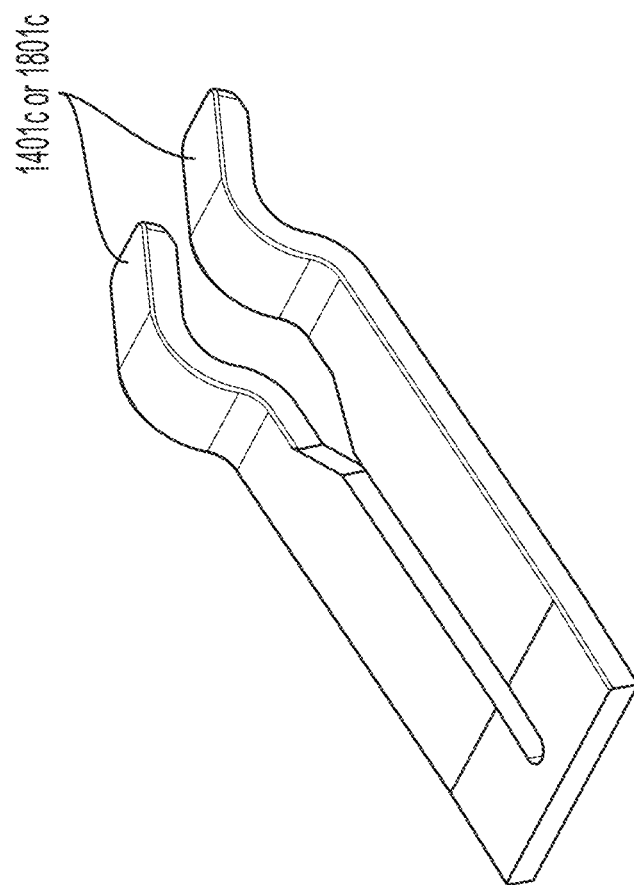
FIG. 16B shows a bottom perspective view of the pair of first fingers of FIG. 16A.
Figure 16A:
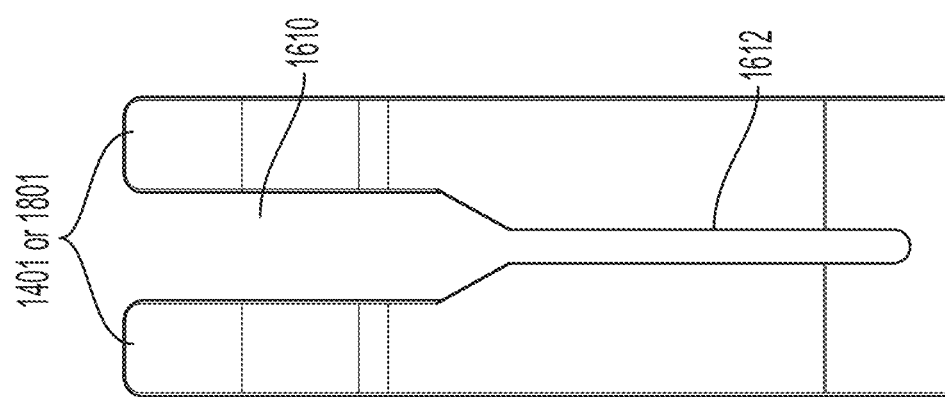
FIG. 16A shows a bottom plan view of a pair of first fingers of a power terminal, according to an embodiment of the present technology.
Figure 16C:
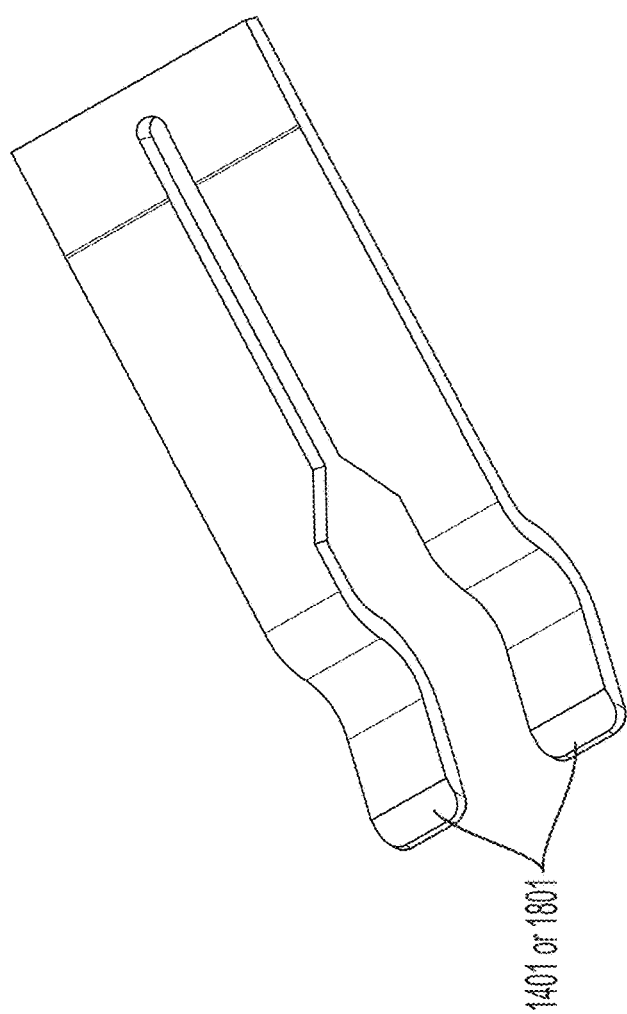
FIG. 16C shows a top perspective view of the pair of first fingers of FIG. 16A.
Figure 16D:
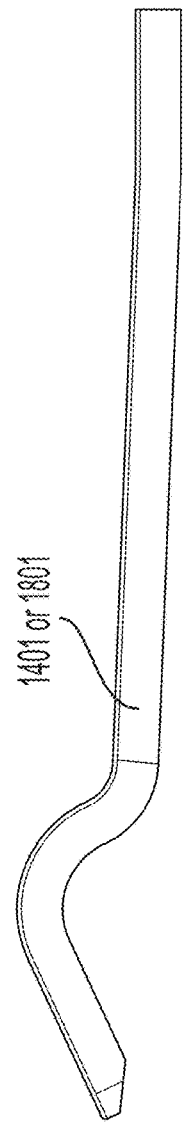
FIG. 16D shows a side elevational view of the pair of first fingers of FIG. 16A.

FIG. 16A shows a bottom plan view of a first sheet of metal used to form the power terminal 1400, stamped to form the pair of first fingers 1401. FIG. 16B shows a bottom perspective view of the pair of first fingers 1401. FIG. 16C shows a top perspective view of the pair of first fingers 1401. FIG. 16D shows a side elevational view of the pair of first fingers 1401. As can be seen in FIGS. 16A-16D, the first fingers 1401 are stamped to leave a larger gap 1610 between adjacent fingers 1401 in a distal region, and a smaller gap 1612 in a proximal region, closer to the base (not shown). The larger gap 1610 may accommodate a distal segment of the second finger 1402. The smaller gap 1612 may enable the first fingers 1401 to flex independently of each other.

FIG. 17A shows a bottom plan view of a second sheet of metal used to form the power terminal 1400, stamped to form the second finger 1402. FIG. 17B shows a bottom perspective view of the second finger 1402. FIG. 17C shows a side elevational view of the second finger 1402.

A total width $D_A$ of the first fingers 1401 at the second ends 1401b, at a region external to the base 1403, may be within 10% of a width $D_B$ at the second end 1402b of the second finger 1402 at a region external to the base 1403. The widths $D_A$, $D_B$ may be dimensions parallel to the row direction R.

A width $D_C$ at the first end 1401a of at least one of the first fingers 1401 may be within 10% of a width $D_D$ at the first end 1402a of the second finger 1402. The widths $D_C$, $D_D$ may be dimensions parallel to the row direction R.

The second finger 1402 may have a first, distal segment 1402t (or 1802t for terminal 1800) that fits in the gap 1610 between the first fingers 1401 (or 1801) of the first sheet. The second finger 1402 may have a second, proximal segment 1402s (or 1802s for the second power terminal 1800). The first segment 1402t may have a width $D_D$. An average width of the second segment 1402s may be greater than an average width of the first segment 1402t. This configuration enables a distal end of finger 1402 to fit in gap 1610 between fingers 1401, while providing a lower resistance for finger 1402 than were second finger 1402 of uniform width. This shape may also provide a greater wipe length.

The width $D_B$ at the second end 1402b of the second finger 1402, at a region external to the base 1403 (not shown in FIGS. 17A-17C), may be greater than the width $D_D$ at the first end 1402a of the second finger 1402. The second segment 1402s of the second finger 1402 may have a width that increases from the width $D_D$, where the second segment 1402s is joined to first segment 1402t, to the width $D_B$ at the base 1403. The width may increase monotonically over the second segment 1402s. In the embodiment illustrated, for example, the width tapers linearly. However, the second segment 1402s need not have the same width as the first segment 1402t where segments 1402t and 1402s join. The second segment 1402s, for example, may have the width $D_B$ over its entire length or otherwise have a width larger than the width $D_B$ where the first and second segments 1402t, 1402s join.

Embodiment 1

According to aspects of a first embodiment of the present technology, a power terminal for use in a connector is provided. The power terminal may comprise a first plurality of first fingers and a second plurality of second fingers. The first plurality may be greater in number than the second plurality. The first plurality of first fingers may comprise first ends spaced apart from each other in a first direction and second ends connected to each other. The second plurality of second fingers may comprise first ends spaced apart from each other in the first direction and second ends connected to each other. The first ends of the second fingers may be spaced apart from the first ends of the first fingers in a second direction, perpendicular to the first direction. The second ends of the first fingers may be electrically connected to the second ends of the second fingers at a joint region. The first ends of the first fingers may have first contact points configured to contact a first side of a card, and the first ends of the second fingers may have second contact points configured to contact the first side of the card. The first contact points may be different from the second contact points.

A terminal according to the first embodiment may have one or more of the following characteristics:

A distance (d2) between one of the first contact points and a nearest one of the second contact points may be in a range between 1.5 mm to 3.5 mm. Alternatively, the distance (d2) may be less than or equal to 3.5 mm.

A length of the first fingers may be less than a length of the second fingers.

A thickness of the first fingers may be less than a thickness of the second fingers. For example, the thickness of the first fingers may be between 0.15 mm to 0.25 mm less than the thickness of the second fingers.

At least one of the second fingers may comprise an elongate straight main body and a hook-shaped first end connected to the straight main body. The second contact point of the at least one of the second fingers may be on the hook-shaped first end.

The hook-shaped first end may comprise a convex surface, and the second contact point of the at least one of the second fingers may be on the convex surface of the hook-shaped first end.

At least one of the first fingers may comprise an elongate main body having at least one bend and a curved first end connected to the main body. The first contact point of the at least one of the first fingers may be on the curved first end.

The curved first end may comprise a convex surface. The first contact point of the at least one of the first fingers may be on the convex surface of the curved first end.

At least one of the second fingers may comprise an elongate straight main body and a hook-shaped first end connected to the straight main body. The hook-shaped first end may have an opening facing the joint region.

A minimum distance from the straight main body of the at least one of the second fingers to a tip of the hook-shaped first end connected to the straight main body of the at least one of the second fingers may be greater than a minimum distance from the straight main body of the at least one of the second fingers to a tip of the curve-shaped first end of the at least one of the first fingers, such that the opening facing the joint region may face the tip of the curved-shape first end of the at least one of the first fingers.

The first fingers may be disposed in a first row in a row direction, and the second fingers may be disposed in a second row in a second direction parallel to the row direction. A width of at least one of the first fingers in a direction parallel to the row direction may be less than a width of at least one of the second fingers in a direction parallel to the row direction.

A terminal according to the first embodiment may be in combination with an insulative housing in which the first fingers and the second fingers are disposed. The combination may have one or more of the following characteristics:

The insulative housing may comprise at least one opening exposing the first and second contact points, and a slot configured to receive the card therein.

The slot may have a closed end configured to limit an insertion distance of the card into the slot.

A distance between the second contact points and the closed end of the slot may be in a range between 7.5 mm to 9.5 mm.

The distance between the second contact points and the closed end of the slot may be a wipe length of the terminal.

A distance (d3) between the first contact points and the closed end of the slot may be in a range between 4.5 mm to 6.5 mm.

Embodiment 2

According to aspects of a second embodiment of the present technology, a power terminal assembly for a card edge connector is provided. The terminal assembly may comprise first and second terminals and an insulative housing supporting the first and second terminals. Each of the first and second terminals may comprise a first plurality of first fingers comprising first ends spaced apart from each other in a first direction and second ends connected to each other, and a second plurality of second fingers comprising first ends spaced apart from each other in the first direction and second ends connected to each other. For each of the first and second terminals: the first ends of the second fingers may be spaced apart from the first ends of the first fingers in a second direction, perpendicular to the first direction; the first plurality may be greater in number than the second plurality; and the second ends of the first fingers may be electrically connected to the second ends of the second fingers at a joint region.

For the first terminal, the first ends of the first fingers may have first contact points configured to contact a first side of a card, the first ends of the second fingers may have second contact points configured to contact the first side of the card, and the first contact points may be different from the second contact points. For the second terminal, the first ends of the first fingers may have first contact points configured to contact a second side of the card, the first ends of the second fingers may have second contact points configured to contact the second side of the card, and the first contact points may be different from the second contact points. A portion of each of the first and second terminals may be disposed in the insulative housing such that the first and second contact points of the second terminal may face the first and second contact points of the first terminal across a gap.

A terminal assembly according to the second embodiment may have one or more of the following characteristics:

A distance (d2) between one of the first contact points of the first terminal and a nearest one of the second contact points of the first terminal may be less than 3.5 mm. For example, the distance (d2) may be in a range of 2.5 mm to 3.5 mm.

The insulative housing may comprise openings exposing the first and second contact points of the first and second terminals, and a slot configured to receive the card therein, the slot comprising the gap.

The slot may have a closed end configured to limit an insertion distance of the card into the slot.

A distance (d1) between the second contact points of the first and second terminals and the closed end of the slot may be in a range between 7.5 mm to 9.5 mm.

The distance (d1) between the second contact points of the first and second terminals and the closed end of the slot may be a wipe length of the terminal.

A distance (d3) between the first contact points of the first and second terminals and the closed end of the slot may be in a range between 4.5 mm to 6.5 mm.

The first fingers of the first and second terminals may be closer to a closed end of the slot than the second fingers of the first and second terminal.

Embodiment 3

According to aspects of a third embodiment of the present technology, a power terminal for a connector is provided. The power terminal may comprise first and second conductive sheets. The first conductive sheet may comprise at least two first fingers comprising first ends spaced apart from each other and second ends connected to each other. The second conductive sheet may comprise a second finger comprising a first end and a second end.

The first ends of the first and second fingers each may have a contact surface thereon. The first end of the second finger may be positioned in a space between the first ends of adjacent ones of the first fingers. The second finger may comprise a first segment comprising the first end of the second finger and having a first average width, and a second segment joined to the first segment and having a second average width greater than the first average width.

A terminal according to the third embodiment may have one or more of the following characteristics:

A total width of the first fingers at the second ends may be within 10% of a width at the second end of the second finger external to the base. Each of the widths at the second ends of the first and second fingers may be a dimension parallel to the row direction.

A width at the first end of at least one of the first fingers may be within 10% of a width at the first end of the second finger. Each of the widths at the first ends of the at least one first finger and the second finger being a dimension parallel to the row direction.

A width at the second segment may increase from a first end, joined to the first segment, to a second end, opposite the first end.

The width of the second segment may taper linearly to the width at the first end of the second finger.

A terminal assembly may comprise a plurality of terminals according to the third embodiment in combination with an insulative member. The combination may have one or more of the following characteristics:

The plurality of terminals may comprise a first terminal and a second terminal. The insulative member may be attached to the first terminal and the second terminal, such that contact surfaces of the second terminal may face contact surfaces of the first terminal across a gap.

The second terminal may be a duplicate of the first terminal, such that the contact surfaces of the second terminal may directly face the contact surfaces of the first terminal across the gap.

The second terminal may comprise a pair of first fingers and a second finger. The second fingers of the first and second terminals may have intermediate portions that face each other across the gap. A card-receiving slot may be disposed between the intermediate portions of the second fingers that face each other across the gap, and the contact surfaces of the first and second terminals that face each other across the gap.

A portion of the insulative member between the first and second insertions portions may be configured to limit an insertion distance of a card inserted into the card-receiving slot.

The contact surfaces of the first terminal may be configured to contact a first side of the card, and the contact surfaces of the second terminal may be configured to contact a second side of the card.

Embodiment 4

According to aspects of a fourth embodiment of the present technology, a power terminal for a connector is provided. The terminal may comprise a first terminal portion comprising a plurality of metal layers stacked in a layer direction. Each metal layer may comprise fingers arranged in a row direction different from the layer direction. The fingers of the metal layers may form rows of contact surfaces such that a first row of contact surfaces corresponding to a first one of the metal layers may be parallel to a second row of contact surfaces corresponding to a second one of the metal layers.

The fingers of the first one of the metal layers may comprise distal ends curved into hooks having convex surfaces. The first row of contact surfaces may be disposed on the convex surfaces of the hooks of the first one of the metal layers. The fingers of the second one of the metal layers may comprise curved distal ends having convex surfaces. The second row of contact surfaces may be disposed on the convex surfaces of the curved distal ends of the fingers of the second one of the metal layers. The rows of contact surfaces of the metal layers of the first terminal portion may be configured to contact a same mating surface.

A terminal according to the fourth embodiment may have one or more of the following characteristics:

The fingers of one of the metal layers may have a length that is different from a length of the fingers of another one of the metal layers.

The fingers of one of the metal layers may have a length that is same as a length of the fingers of another one of the metal layers.

A total number of metal layers may be three or four or more.

The terminal may further comprise a second terminal portion comprising a plurality of metal layers stacked in the layer direction. Each metal layer of the second terminal portion may comprise fingers arranged in direction parallel to the row direction. The fingers of the metal layers of the second terminal portion may form rows of contact surfaces such that a first row of contact surfaces corresponding to a first one of the metal layers of the second terminal portion may be parallel to a second row of contact surfaces corresponding to a second one of the metal layers of the second terminal portion. The fingers of the first one of the metal layers of the second terminal portion may comprise distal ends curved into hooks having convex surfaces. The first row of contact surfaces of the second terminal portion may be disposed on the convex surfaces of the hooks of the first one of the metal layers of the second terminal portion. The fingers of the second one of the metal layers of the second terminal portion may comprise curved distal ends having convex surfaces. The second row of contact surfaces of the second terminal portion may be disposed on the convex surfaces of the curved distal ends of the fingers of the second one of the metal layers of the second terminal portion. The rows of contact surfaces of the metal layers of the second terminal portion may be configured to contact an opposite side of the card from the rows of contact surfaces of the metal layers of the first terminal portion.

Each of the fingers of the metal layers may be configured to carry up to 30 amps of current, or to 35 amps of current, or up to 40 amps of current, or up to 45 amps of current, with a maximum temperature increase of 30° C. above an ambient temperature.

CONCLUSION

The foregoing features may be used, separately or together in any combination, in any of the embodiments discussed herein.

Further, although advantages of the present invention are indicated, it should be appreciated that not every embodiment of the invention will include every described advantage. Some embodiments may not implement any features described as advantageous herein. Accordingly, the foregoing description and attached drawings are by way of example only.

Variations on the disclosed embodiment are possible. For example, though power terminals are described as configured for use in card edge connectors, terminals with mating interfaces as described herein may be used in connectors configured to mate with other types of components. For example, power terminals as described herein may be inserted in a connector housing configured to receive a bus bar or blade-type terminals held in a housing of a mating connector.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the description and the claims to modify an element does not by itself connote any priority, precedence, or order of one element over another, or the temporal order in which acts of a method are performed, but are used merely as labels to distinguish one element or act having a certain name from another element or act having a same name (but for use of the ordinal term) to distinguish the elements or acts.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

As used herein in the specification and in the claims, the phrase "equal" or "the same" in reference to two values (e.g., distances, widths, etc.) means that two values are the same within manufacturing tolerances. Thus, two values being equal, or the same, may mean that the two values are different from one another by +5%.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

Also, the phraseology and terminology used herein is for the purpose of description and should not be regarded as limiting. Use of terms such as "including," "comprising," "comprised of," "having," "containing," and "involving," and variations thereof herein, is meant to encompass the items listed thereafter and equivalents thereof as well as additional items.

The terms "approximately" and "about" if used herein may be construed to mean within ±20% of a target value in some embodiments, within ±10% of a target value in some embodiments, within ±5% of a target value in some embodiments, and within ±2% of a target value in some embodiments. The terms "approximately" and "about" may equal the target value.

The term "substantially" if used herein may be construed to mean within 95% of a target value in some embodiments, within 98% of a target value in some embodiments, within 99% of a target value in some embodiments, and within 99.5% of a target value in some embodiments. In some embodiments, the term "substantially" may equal 100% of the target value.

What is claimed is:

1. A power terminal for a connector, the power terminal comprising:
   a first conductive sheet comprising at least two first fingers comprising first ends spaced apart from each other and second ends connected to each other; and
   a second conductive sheet comprising at least one second finger comprising a first end and a second end, wherein:
      the first ends of the first and second fingers each have a contact surface thereon,
      the first end of the at least one second finger is positioned between the first ends of adjacent ones of the first fingers,
      the contact surfaces of the first ends of the first and second fingers are coplanar and are aligned in a row direction,
      the first end of a second finger of the at least one second finger has a smaller width than that of the second end of the second finger, and
      the second finger is tapered in a region between the first end and the second end.

2. The power terminal of claim 1, wherein the second end of the at least one second finger is stacked on the second ends of the at least two first fingers.

3. The power terminal of claim 1, further comprising:
   an insulative member supporting the second ends of the at least two first fingers and the second end of the at least one second finger.

4. The power terminal of claim 3, wherein the second ends of the at least two first fingers and the second end of the at least one second finger are inserted into the insulative member.

5. The power terminal of claim 3, wherein the insulative member is molded around the second ends of the at least two first fingers and the second end of the at least one second finger.

6. The power terminal of claim 1, wherein the first conductive sheet is welded to the second conductive sheet.

7. The power terminal of claim 1, wherein:
   the first conductive sheet comprises more fingers than the second conductive sheet; and
   the second conductive sheet comprises at least on finger with a larger average width than the fingers of the first conductive sheet.

8. The power terminal of claim 1, wherein the at least one second finger comprises:
   a first segment comprising the first end of the at least one second finger and having a first average width, and
   a second segment joined to the first segment and having a second average width greater than the first average width.

9. A power terminal for a connector, the power terminal comprising:
   a first conductive sheet comprising at least two first fingers comprising first ends spaced apart from each other and second ends connected to each other; and
   a second conductive sheet comprising at least one second finger comprising a first end and a second end, wherein:
      the first ends of the first and second fingers each have a contact surface thereon,
      the first end of the at least one second finger is positioned between the first ends of adjacent ones of the first fingers,
      the contact surfaces of the first ends of the first and second fingers are coplanar and are aligned in a row direction, and
      a gap between the first fingers at a distal region, near the first ends of the first fingers, is larger than a gap between the first fingers at a proximal region, near the second ends of the first fingers.

10. A power terminal assembly for a connector, the power terminal assembly comprising:
    a first power terminal, comprising:
       a first conductive sheet comprising at least two first fingers comprising first ends spaced apart from each other and second ends connected to each other; and
       a second conductive sheet comprising at least one second finger comprising a first end and a second end, wherein:
          the first ends of the first and second fingers each have a contact surface thereon, and
          the first end of the at least one second finger is positioned between the first ends of adjacent ones of the first fingers;
    a second power terminal, comprising:
       a third conductive sheet comprising at least two third fingers comprising first ends spaced apart from each other and second ends connected to each other; and
       a fourth conductive sheet comprising at least one fourth finger comprising a first end and a second end, wherein:
          the first ends of the third and fourth fingers each have a contact surface thereon, and
          the first end of the at least one fourth finger is positioned between the first ends of adjacent ones of the third fingers; and
    an insulative member supporting the first and second power terminals, wherein the first and second power terminals are positioned such that the contact surfaces of the first and second fingers of the first power terminal face the contact surfaces of the third and fourth fingers of the second power terminal across a gap.

11. The power terminal assembly of claim 10, wherein the contact surfaces of the first ends of the first and second fingers of the first power terminal are coplanar.

12. The power terminal assembly of claim 10, wherein the contact surfaces of the first ends of the first and second fingers of the first power terminal are aligned in a row direction.

13. The power terminal assembly of claim 10, wherein the insulative member supporting the first and second power terminals supports the second ends of the first, second, third and fourth fingers.

14. The power terminal assembly of claim 10, wherein at least a portion of the first and second conductive sheets of the first power terminal and at least a portion of the second and third conductive sheets of the second power terminal are inserted into the insulative member.

15. The power terminal assembly of claim 10, wherein the insulative member is molded around at least a portion of the first and second conductive sheets of the first power terminal and at least a portion of the second and third conductive sheets of the second power terminal.

16. The power terminal assembly of claim 10, wherein the first conductive sheet is welded to the second conductive sheet and the third conductive sheet is welded to the fourth conductive sheet.

17. The power terminal assembly of claim 10, wherein:
the first conductive sheet comprises more fingers than the second conductive sheet; and
the second conductive sheet comprises at least on finger with a larger average width than the fingers of the first conductive sheet.

18. The power terminal assembly of claim 10, wherein the at least one second finger of the first power terminal comprises:
a first segment comprising the first end of the at least one second finger and having a first average width, and
a second segment joined to the first segment and having a second average width greater than the first average width.

19. The power terminal assembly of claim 10, wherein a gap between the first fingers of the first power terminal at a distal region, near the first ends of the first fingers, is larger than a gap between the first fingers at a proximal region, near the second ends of the first fingers.

20. The power terminal assembly of claim 10, wherein the contact surfaces of the first and second fingers of the first power terminal are configured to contact a first side of a card inserted into the gap and the third and fourth fingers of the second power terminal are configured to contact a second side of the card.

* * * * *